United States Patent
Kao et al.

(10) Patent No.: US 12,501,697 B2
(45) Date of Patent: *Dec. 16, 2025

(54) METHODS OF FORMING SEMICONDUCTOR DEVICES

(71) Applicant: Taiwan Semiconductor Manufacturing Co., Ltd., Hsinchu (TW)

(72) Inventors: Wan-Yi Kao, Baoshan Township (TW); Szu-Ping Lee, Changhua County (TW); Che-Hao Chang, Hsinchu (TW); Chun-Heng Chen, Hsinchu (TW); Yung-Cheng Lu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/657,175

(22) Filed: May 7, 2024

(65) Prior Publication Data

US 2024/0304628 A1    Sep. 12, 2024

Related U.S. Application Data

(63) Continuation of application No. 17/961,949, filed on Oct. 7, 2022, now Pat. No. 12,015,031, which is a
(Continued)

(51) Int. Cl.
*H01L 29/76*    (2006.01)
*H01L 31/062*    (2012.01)
(Continued)

(52) U.S. Cl.
CPC ......... *H10D 84/853* (2025.01); *H10D 30/024* (2025.01); *H10D 30/6211* (2025.01);
(Continued)

(58) Field of Classification Search
CPC ......... H01L 27/0924; H01L 21/823418; H01L 21/823431; H01L 29/0649;
(Continued)

(56) References Cited

U.S. PATENT DOCUMENTS 6,498,383 B2    12/2002    Beyer et al.
8,796,666 B1    8/2014    Huang et al.
(Continued)

FOREIGN PATENT DOCUMENTS

CN    1528015 A    9/2004
KR    20170027128 A    3/2017
(Continued)

*Primary Examiner* — Theresa T Doan
(74) *Attorney, Agent, or Firm* — Slater Matsil, LLP

(57) ABSTRACT

In an embodiment, a method includes: forming a first fin and a second fin extending from a semiconductor substrate; depositing a liner layer along a first sidewall of the first fin, a second sidewall of the second fin, and a top surface of the semiconductor substrate, the liner layer formed of silicon oxynitride having a nitrogen concentration; depositing a fill material on the liner layer, the fill material formed of silicon; annealing the liner layer and the fill material, the annealing converting the fill material to silicon oxide, the annealing decreasing the nitrogen concentration of the liner layer; and recessing the liner layer and the fill material to form an isolation region between the first fin and the second fin.

20 Claims, 17 Drawing Sheets

Related U.S. Application Data continuation of application No. 17/149,950, filed on Jan. 15, 2021, now Pat. No. 11,469,229.

(51) Int. Cl.

| | | |
|---|---|---|
| *H10D 30/01* | (2025.01) | |
| *H10D 30/62* | (2025.01) | |
| *H10D 62/10* | (2025.01) | |
| *H10D 84/01* | (2025.01) | |
| *H10D 84/03* | (2025.01) | |
| *H10D 84/85* | (2025.01) | |

(52) U.S. Cl.
CPC ......... *H10D 62/115* (2025.01); *H10D 84/013* (2025.01); *H10D 84/0158* (2025.01); *H10D 84/038* (2025.01)

(58) Field of Classification Search
CPC ........... H01L 29/66795; H01L 29/7851; H01L 21/823878; H01L 21/823821; H01L 21/76227; H01L 27/0886; H01L 29/785; H01L 21/02126; H01L 21/02164; H01L 21/02271; H01L 21/76224
USPC ......................................................... 257/288
See application file for complete search history.

(56) References Cited

U.S. PATENT DOCUMENTS

| | | | |
|---|---|---|---|
| 10,038,093 | B2 | 7/2018 | Sung et al. |
| 10,971,391 | B2 | 4/2021 | Peng |
| 11,069,812 | B2 | 7/2021 | Kao et al. |
| 11,183,423 | B2 | 11/2021 | Chou |
| 11,469,229 | B2 * | 10/2022 | Kao .................... H01L 29/7851 |
| 2015/0028426 | A1 | 1/2015 | Ching et al. |
| 2016/0322358 | A1 | 11/2016 | Ching et al. |
| 2019/0067027 | A1 | 2/2019 | Wang et al. |
| 2019/0067283 | A1 | 2/2019 | Wang et al. |
| 2019/0157156 | A1 | 5/2019 | Chen et al. |
| 2019/0165116 | A1 | 5/2019 | Lim et al. |
| 2020/0161171 | A1 | 5/2020 | Colombeau et al. |

FOREIGN PATENT DOCUMENTS

| | | |
|---|---|---|
| KR | 20170043683 A | 4/2017 |
| KR | 20190024567 A | 3/2019 |
| KR | 20190062205 A | 6/2019 |
| KR | 20200037088 A | 4/2020 |
| KR | 20200058298 A | 5/2020 |
| TW | 202002077 A | 1/2020 |

* cited by examiner

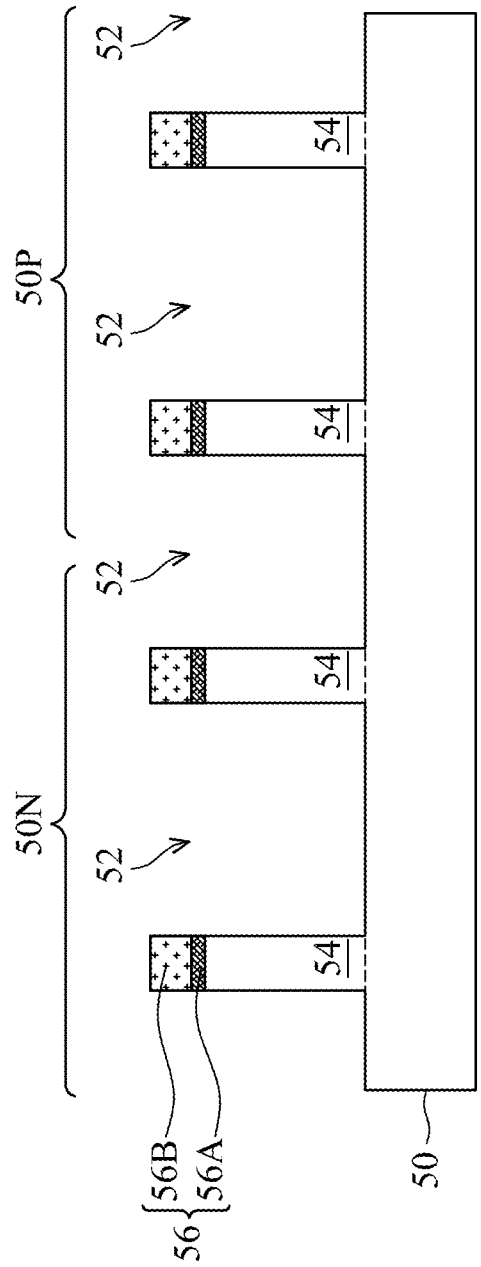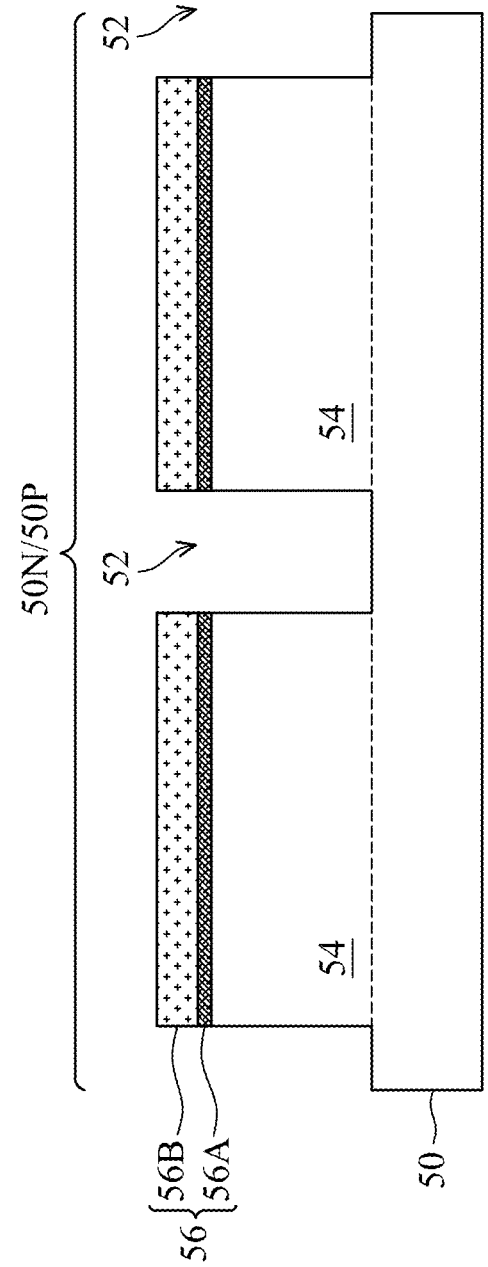
Figure 2A
Figure 2B

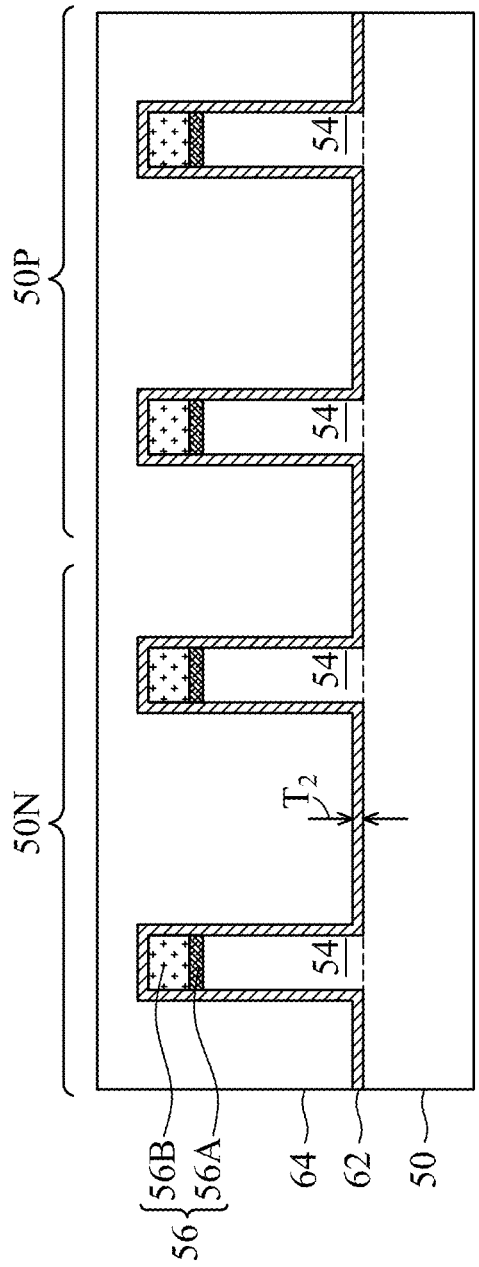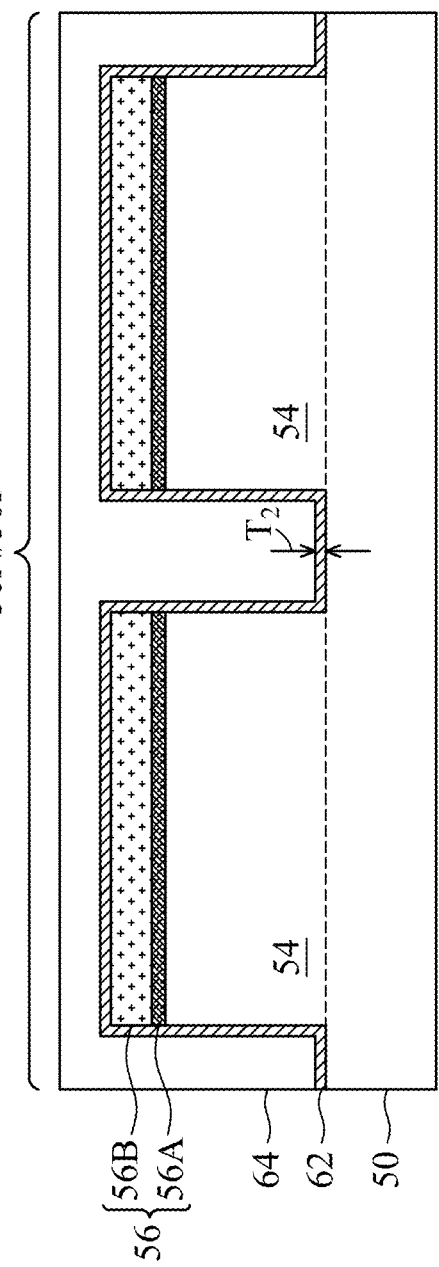
Figure 5A
Figure 5B

METHODS OF FORMING SEMICONDUCTOR DEVICES

PRIORITY CLAIM AND CROSS-REFERENCE

This application is a continuation of U.S. patent application Ser. No. 17/961,949, filed on Oct. 7, 2022, entitled "Semiconductor Device and Method," which application is a continuation U.S. patent application Ser. No. 17/149,950, filed on Jan. 15, 2021, entitled "Semiconductor Device and Method," now U.S. Pat. No. 11,469,229, issued on Oct. 11, 2022, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 4A, 4B, 5A, 5B, 6A, and 6B are cross-sectional views of intermediate stages in the manufacturing of FinFETs, in accordance with some embodiments.

DETAILED DESCRIPTION

Figure 1:
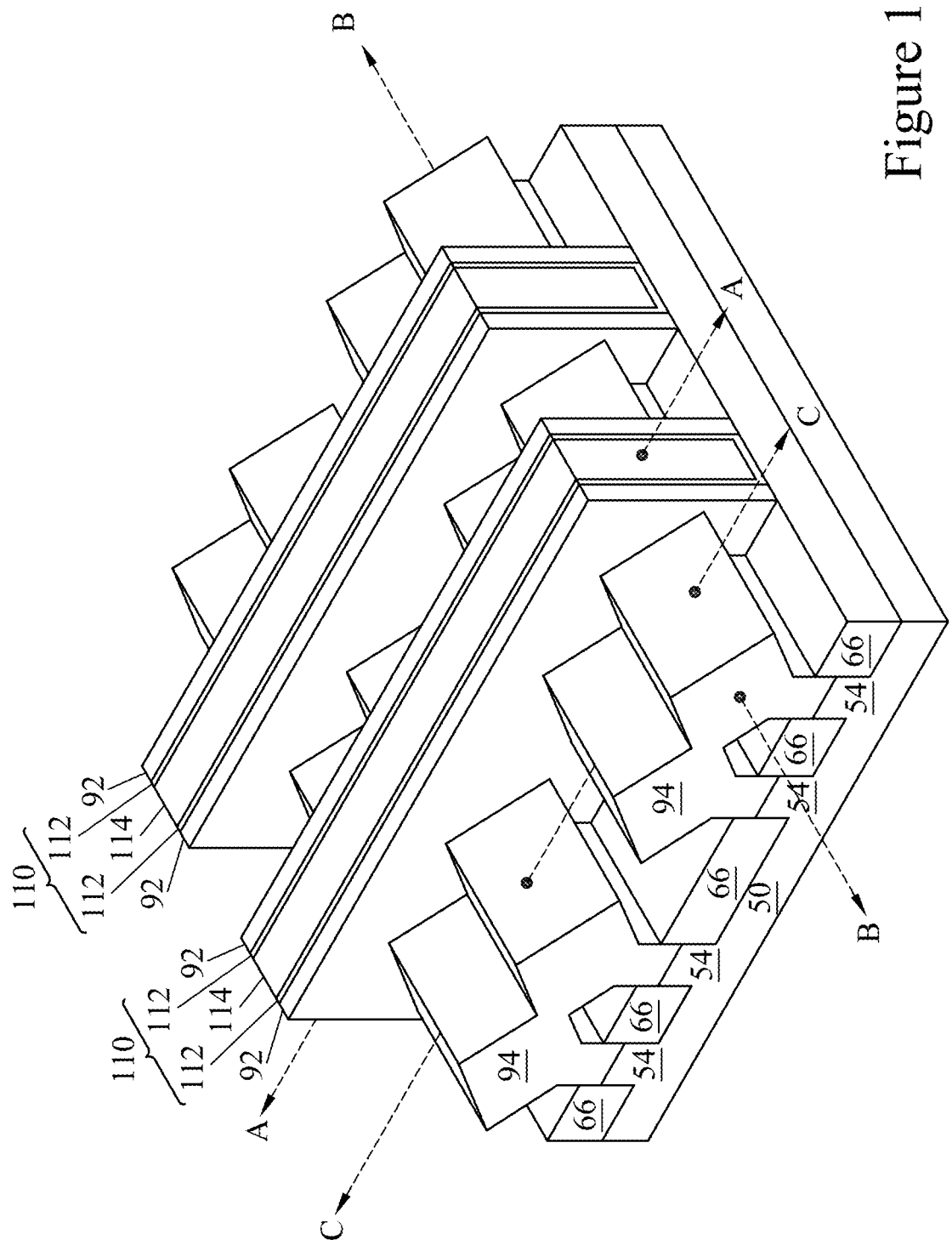
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, shallow trench isolation (STI) regions are formed having a liner of silicon oxynitride and a fill material of silicon oxide. The silicon oxynitride has a nitrogen concentration that is selected to protect underlying features (e.g., semiconductor fins) from oxidation during subsequent processing. For example, during the process for forming the fill material of the STI regions, an anneal can be performed. The liner has a sufficient nitrogen concentration to protect the semiconductor fins from oxidation during the anneal process, but also has a nitrogen concentration low enough that etch loading during subsequent processing is avoided.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 54 extending from a substrate 50. STI regions 66 are disposed over the substrate 50, and the fins 54 protrude above and from between neighboring STI regions 66. Although the STI regions 66 are described/illustrated as being separate from the substrate 50, as used herein the term "substrate" may be used to refer to just the semiconductor substrate or a semiconductor substrate inclusive of isolation regions. Additionally, although the fins 54 are illustrated as being a single, continuous material of the substrate 50, the fins 54 and/or the substrate 50 may include a single material or a plurality of materials. In this context, the fins 54 refers to the portions extending above and from between the neighboring STI regions 66.

Gate structures 110 are over channel regions of the fins 54. The gate structures 110 include gate dielectrics 112 and gate electrodes 114. The gate dielectrics 112 are along sidewalls and over top surfaces of the fins 54, and the gate electrodes 114 are over the gate dielectrics 112. Source/drain regions 94 are disposed in opposite sides of the fins 54 with respect to the gate structures 110. Gate spacers 92 separate the source/drain regions 94 from the gate structures 110. In embodiments where multiple transistors are formed, the source/drain regions 94 may be shared between various transistors. In embodiments where one transistor is formed from multiple fins 54, neighboring source/drain regions 94 may be electrically coupled, such as through coalescing the source/drain regions 94 by epitaxial growth, or through coupling the source/drain regions 94 with a same source/drain contact. One or more inter-layer dielectric (ILD) layer(s) (discussed further below) are over the source/drain regions 94 and/or gate electrodes 114, through which contacts (discussed further below) to the source/drain regions 94 and the gate electrodes 114 are formed.

FIG. 1 further illustrates several reference cross-sections. Cross-section A-A is along a longitudinal axis of a gate electrode 114. Cross-section B-B is perpendicular to cross-section A-A and is along a longitudinal axis of a fin 54. Cross-section C-C is parallel to cross-section A-A and extends through source/drain regions 94 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2A through 6B are cross-sectional views of intermediate stages in the manufacturing of FinFETs, in accordance with some embodiments. FIGS. 2A, 3A, 4A, 5A, and 6A illustrate reference cross-section A-A illustrated in FIG. 1, and show multiple fins 54. FIGS. 2A, 3A, 4A, 5A, and 6A illustrate features in both an n-type region 50N and a p-type region 50P (discussed further below). FIGS. 2B, 3B, 4B, 5B, and 6B illustrate reference cross-section B-B illustrated in FIG. 1, except for multiple fins 54. FIGS. 2B, 3B, 4B, 5B, and 6B illustrate features in either of the n-type region 50N and the p-type region 50P. For example, the structures illustrated in FIGS. 2B, 3B, 4B, 5B, and 6B may be applicable to both the n-type region 50N and the p-type region 50P, and differences (if any) in the structures of the n-type region 50N and the p-type region 50P are described in the text accompanying each figure.

As will be discussed in greater detail below, FIGS. 2A through 6B illustrate a process in which fins 54 (see FIGS. 2A and 2B) are formed and STI regions 66 (see FIGS. 6A and 6B) are formed around the fins 54. FIG. 7 is a flow chart of an example method 200 for forming the fins 54 and the STI regions 66, in accordance with some embodiments. The STI regions 66 are formed by initially forming a liner layer 62 (see FIGS. 3A and 3B) and a fill material 64 (see FIGS. 4A and 4B). The fill material 64 can be formed by a flowable chemical vapor deposition (FCVD) process, where a first material is deposited and then subsequently converted to a second material, such as an oxide. Advantageously, the liner layer 62 is formed of a dielectric material that helps protect the fins 54 from oxidation during conversion of the fill material 64. Such a dielectric material is said to have good "oxidation resistance" in that it helps avoid or reduce oxidation of underlying features, e.g., the fins 54. During the conversion process, the composition of the dielectric material of the liner layer 62 is modified. After the conversion process, the material of the liner layer 62 has a similar etch rate as the fill material 64, relative an etching process used to recess the STI regions 66. Etch loading during subsequent processing steps can thus be avoided or reduced.

In FIGS. 2A and 2B and step 202 of the method 200, a substrate 50 is provided and fins 54 are formed extending from the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

The fins 54 are formed in the substrate 50. The fins 54 are semiconductor strips. In some embodiments, the fins 54 may be formed in the substrate 50 by etching trenches 52 in the substrate 50. The etching may be any acceptable etch process, such as a reactive ion etch (RIE), neutral beam etch (NBE), the like, or a combination thereof, and may be performed with masks 56 having a pattern of the fins 54. The etch may be anisotropic.

The masks 56 may be single layered masks, or may be multilayered masks, such as multilayered masks that each include a first mask layer 56A and a second mask layer 56B. The first mask layer 56A and the second mask layer 56B may each be formed from a dielectric material such as silicon oxide, silicon nitride, a combination thereof, or the like, and may be deposited or thermally grown according to acceptable techniques. The material of the first mask layer 56A may have a high etching selectivity from the etching of the material of the second mask layer 56B. For example, the first mask layer 56A may be formed of silicon oxide, and the second mask layer 56B may be formed of silicon nitride.

The fins 54 may be patterned by any suitable method. For example, the fins 54 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 54. In some embodiments, the masks 56 may remain on the fins 54.

Figure 3A:
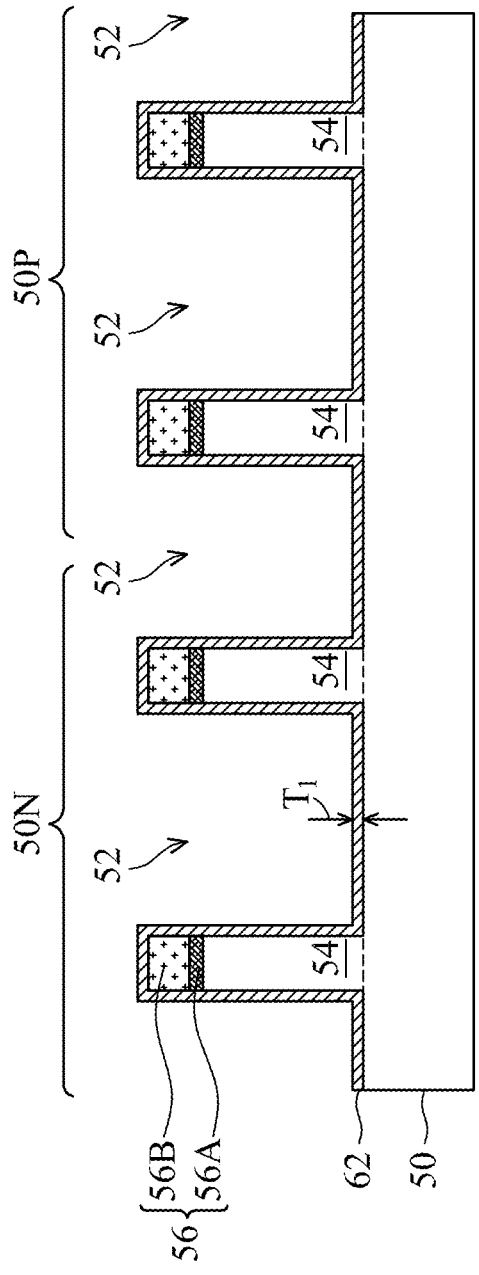
Figure 3B:
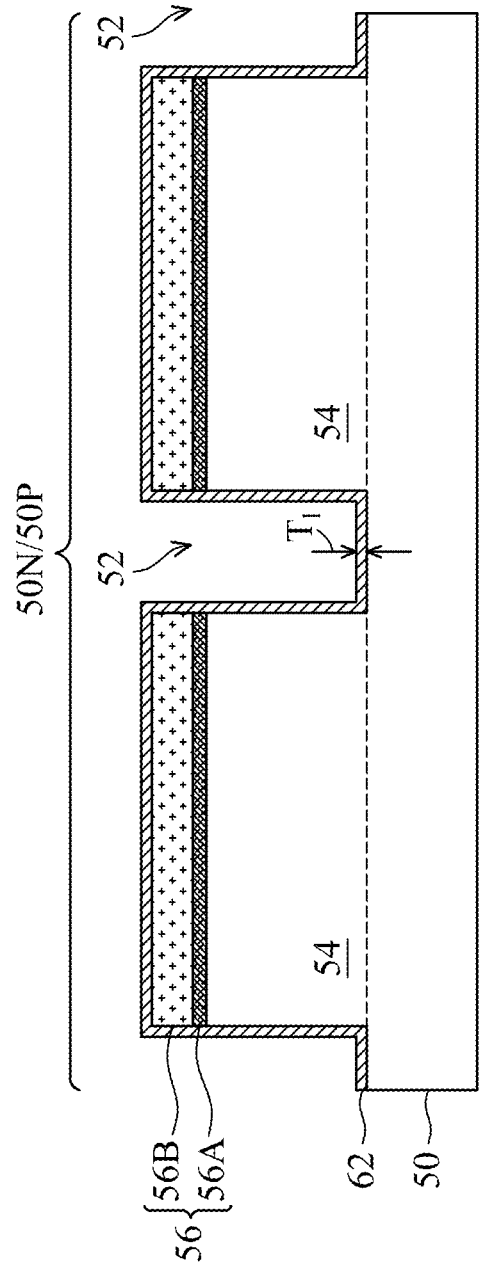

In FIGS. 3A and 3B and step 204 of the method 200, a liner layer 62 is deposited in the trenches 52 in the substrate 50, e.g., on the top surface of the substrate 50, the sidewalls of the fins 54, and the top surfaces of the masks 56 (if present) or the fins 54. The liner layer 62 is formed of a dielectric material that will be modified during subsequent processing. Examples of dielectric materials include silicon oxide, silicon nitride, silicon oxynitride, silicon oxycarbonitride, and the like. The liner layer 62 can be formed by a deposition process, such as atomic layer deposition (ALD), chemical vapor deposition (CVD), plasma-enhanced CVD (PECVD), or the like. In some embodiments, the liner layer 62 is formed of silicon oxynitride by ALD, and the nitrogen concentration (e.g., by atomic percent) of the silicon oxynitride will be decreased in subsequent processing.

As an example to form the liner layer 62, the substrate 50 can be placed in an ALD chamber, in which ALD cycles are performed by sequentially introducing source precursor gases into the ALD chamber, thus depositing the liner layer 62. The ALD process is a conformal deposition process. Accordingly, the thickness of the horizontal portions of the liner layer 62 is equal to the thickness of the vertical portions of the liner layer 62. The thickness $T_1$ of the liner layer 62 is discussed in greater detail below.

In step 206 of the method 200, a first pulse of an ALD cycle is performed by introducing a silicon source precursor into the ALD chamber, thus exposing the substrate 50 to the silicon source precursor. In some embodiments, the silicon source precursor is hexachlorodisilane ($Si_2Cl_6$, HCD), although other silicon source precursors could be used. The first pulse can be performed (e.g., the ALD chamber can be maintained) at a temperature in the range of about 450° C. to about 700° C. and at a pressure in the range of about 50 Pa to about 200 Pa. In some embodiments, no plasma is turned on when the silicon source precursor is introduced into the ALD chamber. During the first pulse, OH bonds at the surface of the substrate 50 are broken. The OH bonds can be present at the surface of the substrate 50 due to the formation of a native oxide and/or exposure to moisture before the ALD process. When the OH bonds are broken, silicon atoms from the silicon source precursor (along with the chlorine atoms bonded to them) are bonded to oxygen atoms to form O—Si—Cl bonds, with each silicon atom bonded to three chlorine atoms. The silicon source precursor can be kept in the ALD chamber for a duration in the range of about 5 seconds to about 120 seconds. The silicon source precursor is then purged from the ALD chamber, such as by an acceptable vacuuming process and/or by flowing an inert gas into the ALD chamber.

In step 208 of the method 200, a second pulse of an ALD cycle is performed by introducing an oxygen source precursor into the ALD chamber, thus exposing the substrate 50 to the oxygen source precursor. In some embodiments, the oxygen source is dioxygen ($O_2$), although other oxygen source precursors could be used. The second pulse can be performed (e.g., the ALD chamber can be maintained) at a temperature in the range of about 450° C. to about 700° C. and at a pressure in the range of about 600 Pa to about 2000 Pa. In some embodiments, no plasma is turned on when the oxygen source precursor is introduced into the ALD chamber. During the second pulse, some of the Si—Cl bonds are broken. When the Si—Cl bonds are broken, oxygen atoms from the oxygen source precursor are bonded to silicon atoms to form O—Si—O bonds. Some O—Si—Cl bonds remain, such that each silicon atom is bonded to two oxygen atoms and one chlorine atom. The oxygen source precursor can be kept in the ALD chamber for a duration in the range of about 5 seconds to about 100 seconds. The oxygen source precursor is then purged from the ALD chamber, such as by an acceptable vacuuming process and/or by flowing an inert gas into the ALD chamber.

In step 210 of the method 200, a third pulse of an ALD cycle is performed by introducing a nitrogen source precursor into the ALD chamber, thus exposing the substrate 50 to the nitrogen source precursor. In some embodiments, nitrogen source precursor is ammonia ($NH_3$), although other nitrogen source precursors could be used. The third pulse can be performed (e.g., the ALD chamber can be maintained) at a temperature in the range of about 450° C. to about 700° C. and at a pressure in the range of about 600 Pa to about 1500 Pa. In some embodiments, no plasma is turned on when the nitrogen source precursor is introduced into the ALD chamber. During the third pulse, the remaining Si—Cl bonds are broken. When the Si—Cl bonds are broken, nitrogen atoms from the nitrogen source precursor are bonded to the silicon atoms to form O—Si—N bonds. As a result, each silicon atom is bonded to two oxygen atoms and one nitrogen atom. Hydrogen atoms from the nitrogen source precursor are also bonded to oxygen atoms to form OH bonds. The nitrogen source precursor can be kept in the ALD chamber for a duration in the range of about 5 seconds to about 100 seconds. The nitrogen source precursor is then purged from the ALD chamber, such as by an acceptable vacuuming process and/or by flowing an inert gas into the ALD chamber.

In above-discussed processes, the pulses sequentially performed in steps 206, 208, 210 may be referred to as an ALD cycle, with the ALD cycle resulting in the growth of an atomic layer (sometimes called a monolayer), which includes silicon atoms and the corresponding bonded nitrogen atoms and oxygen atoms groups. The atomic layer resulting from an ALD cycle can have a thickness in the range of about 20 Å to about 60 Å.

The ALD cycle is then repeated by repeating steps 206, 208, 210, so that a plurality of atomic layers are deposited to form the liner layer 62. In subsequent ALD cycles, the OH bonds formed in a previous ALD cycle are broken, and O—Si—Cl bonds are formed due to the pulsing of the silicon source precursor. Some O—Si—Cl bonds are then replaced with Si—O bonds due to the pulsing of the oxygen source precursor. Other Si—Cl bonds are then replaced with Si—N bonds and more OH bonds are formed due to the pulsing of the nitrogen source precursor.

The ALD cycle is repeated until the liner layer 62 has a desired thickness $T_1$. The thickness $T_1$ can be in the range of about 15 Å to about 50 Å. As will be discussed in greater detail below, depositing the liner layer 62 to have a thickness $T_1$ in this range helps provide sufficient protection from oxidation to the fins 54 and helps avoid etch loading during subsequent processing steps. It should be appreciated that, depending on the desired thickness $T_1$ of the liner layer 62, many atomic layers may be deposited. For example, to form the liner layer 62 with the thickness $T_1$ discussed above, the ALD cycle may be repeated from about 5 to about 100 times. Repeating the ALD cycle a quantity of times in this range allows the liner layer 62 to be formed with such a thickness $T_1$. Repeating the ALD cycle a quantity of times outside of this range may not allow the liner layer 62 to be formed with such a thickness $T_1$.

After the ALD process is completed, the liner layer 62 has a silicon concentration in the range of about 20% to about 50%, an oxygen concentration in the range of about 20% to about 50%, and a nitrogen concentration in the range of about 5% to about 30%. As will be discussed in greater detail below, forming the liner layer 62 with a nitrogen concentration in this range helps provide sufficient protection from oxidation to the fins 54 and helps avoid etch loading during subsequent processing steps. Performing the pulses of the ALD process at the temperatures discussed above and for the durations discussed above allows the liner layer 62 to be formed with such a nitrogen concentration. Performing the pulses of the ALD process outside of the temperatures discussed above or outside of the durations discussed above may not allow the liner layer 62 to be formed with such a nitrogen concentration.

Subsequently, in step 212 of the method 200, a fill material 64 (see FIGS. 4A through 5B) will be formed on the liner layer 62. The fill material 64 can be formed by high density plasma chemical vapor deposition (HDP-CVD), FCVD, or the like. Specifically, and as discussed further below, the fill material 64 is initially formed of a first material and subsequently converted to a second material. In some embodiments, a FCVD process is performed, where the fill material 64 is initially formed of a semiconductor material and subsequently converted to a dielectric material by post curing. Examples of semiconductor materials include silicon, germanium, and the like. Examples of dielectric materials include silicon oxide, silicon nitride, silicon oxynitride, silicon oxycarbonitride, and the like.

Figure 4A:
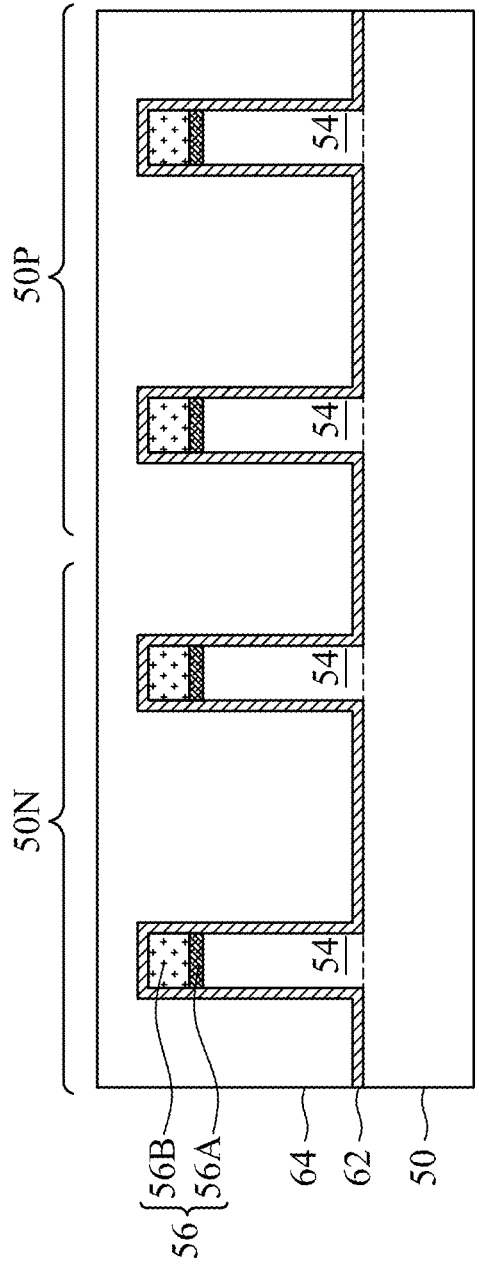
Figure 4B:
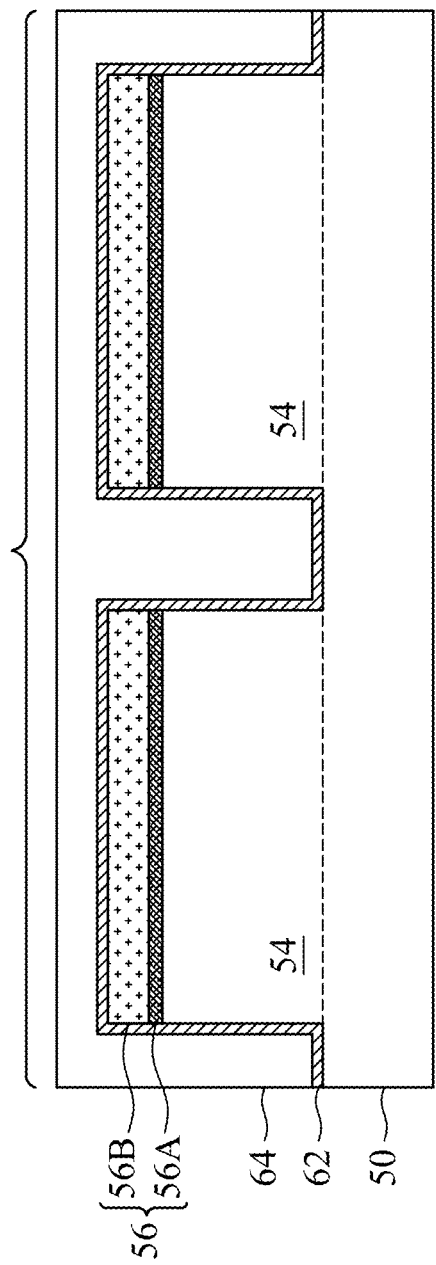

In FIGS. 4A and 4B and step 214 of the method 200, a first layer for the fill material 64 is deposited on the liner layer 62. In the illustrated embodiment, the fill material 64 is a layer of amorphous silicon deposited by a CVD-based material deposition in a remote plasma. As discussed further below, the silicon will be converted to another material, such as an oxide, by post curing.

In FIGS. 5A and 5B and step 216 of the method 200, the liner layer 62 and the fill material 64 are annealed to convert the fill material 64 to a dielectric material. In some embodiments the annealing is by a wet anneal process performed using steam ($H_2O$) as the process gas, although other process gases may be used. The process gas (e.g., $H_2O$) can be produced by in-situ steam generation (ISSG), although other techniques may be used to produce the process gas. The wet anneal process drives oxygen from the process gas (e.g., water/steam) into the fill material 64, thus converting the fill material 64 to a dielectric material. In some embodiments, the fill material 64 is silicon before the wet anneal process and is silicon oxide after the wet anneal process. The wet anneal process is performed at a high temperature, such as a temperature in the range of about 400° C. to about 750° C. The wet anneal process may be performed for a duration in the range of about 1 hour to about 5 hours. Performing the wet anneal process with a temperature below about 400° C. or for a duration of less than about 1 hour may result in insufficient oxidation of the fill material 64, and performing the wet anneal process with a temperature above about 750° C. or for a duration of greater than about 5 hours can cause oxidation of the fins 54. In some embodiments, the temperature of the wet anneal process can be lower when the fins 54 are formed to smaller average critical dimensions, such as less than about 5 nm.

The liner layer 62 protects the fins 54 from oxidation during the wet anneal process. As noted above, the liner layer 62 can be formed of a dielectric material that has good oxidation resistance, such as silicon oxynitride with a nitrogen concentration of at least about 5%. Forming the liner layer 62 of such a dielectric material allows it to block oxygen atoms from being driven into the fins 54 from the fill material 64, as the presence of nitrogen can help block oxidation. Oxidation of the fins 54 can thus be avoided or reduced, which can improve the performance of the FinFETs.

The composition of the dielectric material of the liner layer 62 is modified during the wet anneal process. In embodiments where the liner layer 62 is formed of silicon oxynitride, the wet anneal process drives nitrogen out of the liner layer 62 to decrease the nitrogen concentration of the silicon oxynitride. For example, after the wet anneal process is completed, the liner layer 62 can have a silicon concentration in the range of about 20% to about 50%; an oxygen concentration in the range of about 20% to about 50%; and a nitrogen concentration of less than 10%, such as less than 5%, such as in the range of about 1% to about 5%. The final nitrogen concentration of the liner layer 62 can be down to about 10% of the initial nitrogen concentration of the liner layer 62. In some embodiments, the wet anneal process drives some of the nitrogen out of the liner layer 62, so that the liner layer 62 is silicon oxynitride having a lesser nitrogen concentration after the wet anneal process than before the wet anneal process. In some embodiments, the wet anneal process drives all of the nitrogen out of the liner layer 62, so that the liner layer 62 is silicon oxide after the wet anneal process.

As noted above, the liner layer 62 is formed so that the initial composition of the dielectric material of the liner layer 62 has a nitrogen concentration in the range of about 5% to about 30%. If the initial nitrogen concentration of the liner layer 62 is less than about 5%, the liner layer 62 may not have adequate oxidation resistance to protect the fins 54 from oxidation during the wet anneal process. Specifically, all of the nitrogen may be driven out of the liner layer 62 before the wet anneal process is complete. Undesirable oxidation of the fins 54 may thus occur. If the initial nitrogen concentration of the liner layer 62 is greater than about 30%, the liner layer 62 and the fill material 64 may have different etch rates. Specifically, too much nitrogen may remain in the liner layer 62 after the wet anneal process is complete. The material of the liner layer 62 may thus have a high etching selectivity from the etching of the fill material 64. Undesirable etch loading during subsequent processing steps may thus occur. Decreasing the nitrogen concentration of the liner layer 62 reduces the etch selectivity between the liner layer 62 and the fill material 64. Forming the liner layer 62 to have an initial nitrogen concentration in the range of about 5% to about 30% thus helps avoid or reduce undesirable oxidation of the fins 54, and helps ensure the etch selectivity between the liner layer 62 and the fill material 64 is sufficiently reduced to avoid subsequent etch loading.

Decreasing the nitrogen concentration of the liner layer 62 can improve the electrical performance of the liner layer 62. Specifically, when the liner layer 62 is initially formed with a greater nitrogen concentration, it can have a greater effective oxide charge with respect to the substrate 50, but decreasing the nitrogen concentration of the liner layer 62 also decreases the effective oxide charge with respect to the substrate 50. For example, the interface of the liner layer 62 and the substrate 50 (e.g., each of the fins 54) can have an effective oxide charge ($Q_{eff}$) of up to about $5 \times 10^{11}$ coulombs before the wet anneal process, but can have an effective oxide charge ($Q_{eff}$) of down to about $2 \times 10^{11}$ coulombs after the wet anneal process. Decreasing the effective oxide charge of the interface of the liner layer 62 and the substrate 50 can decrease channel leakage and improve channel mobility of the resulting FinFETs.

The thickness of the liner layer 62 decreases during the wet anneal process. The thickness of the liner layer 62 decreases because some of the liner layer 62 is converted to the fill material 64. Specifically, upper portions of the liner layer 62 (e.g., those portions proximate the fill material 64) can be converted from a material of the liner layer 62 (e.g., silicon oxynitride) to the fill material 64 (e.g., silicon oxide). Conversely, lower portions of the liner layer 62 (e.g., those portions distal the fill material 64) remain as the material of the liner layer 62 (e.g., silicon oxynitride, albeit with a reduced nitrogen concentration). For example, after the wet anneal process is completed, the remaining portions of the liner layer 62 can have a thickness $T_2$ in the range of about 1 Å to about 10 Å. The final thickness $T_2$ of the liner layer 62 can be from about 10% to about 30% of the initial thickness $T_1$ of the liner layer 62.

As noted above, the liner layer 62 is formed so that the initial thickness $T_1$ is in the range of about 15 Å to about 50 Å. If the initial thickness $T_1$ is less than about 15 Å, the liner layer 62 may not have adequate oxidation resistance to protect the fins 54 from oxidation during the wet anneal process. Specifically, the thickness of the liner layer 62 may be decreased to be too small before the wet anneal process is complete, and so the liner layer 62 may be unable block oxygen atoms from being driven into the fins 54 from the fill material 64. Undesirable oxidation of the fins 54 may thus occur. If the initial thickness $T_1$ is greater than about 50 Å, the liner layer 62 and the fill material 64 may have different etch rates. Specifically, the lower portions of the liner layer 62 (e.g., those portions distal the fill material 64) may not have enough nitrogen driven out of them, and so too much nitrogen may remain in the liner layer 62 after the wet anneal process is complete. The material of the liner layer 62 may thus have a high etching selectivity from the etching of the fill material 64. Undesirable etch loading during subsequent processing steps may thus occur. Forming the liner layer 62 to have an initial thickness $T_1$ in the range of about 15 Å to about 50 Å thus helps avoid or reduce undesirable oxidation of the fins 54 and subsequent etch loading.

Figure 6A:
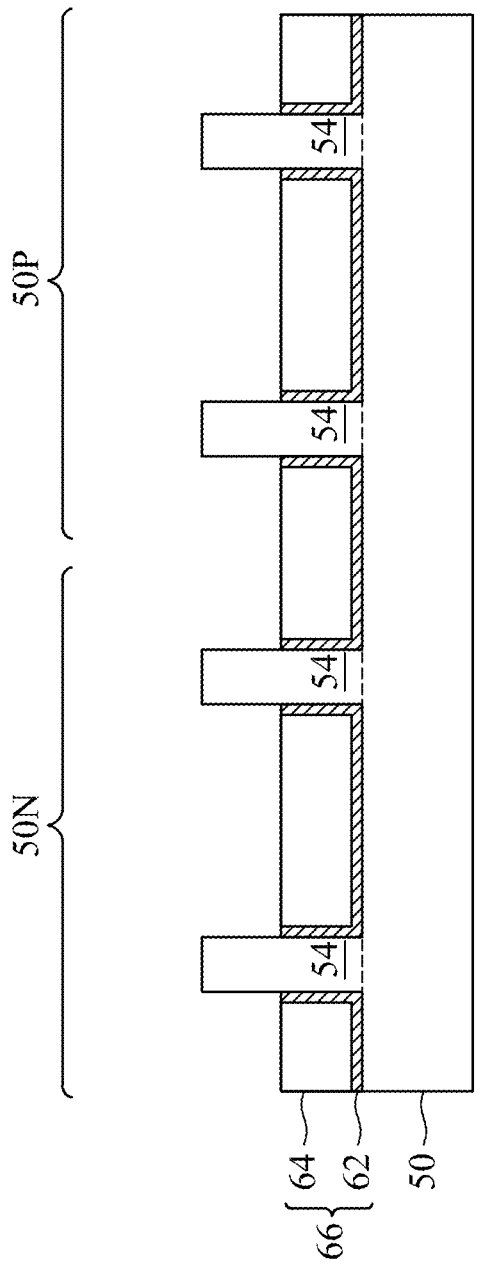
Figure 6B:
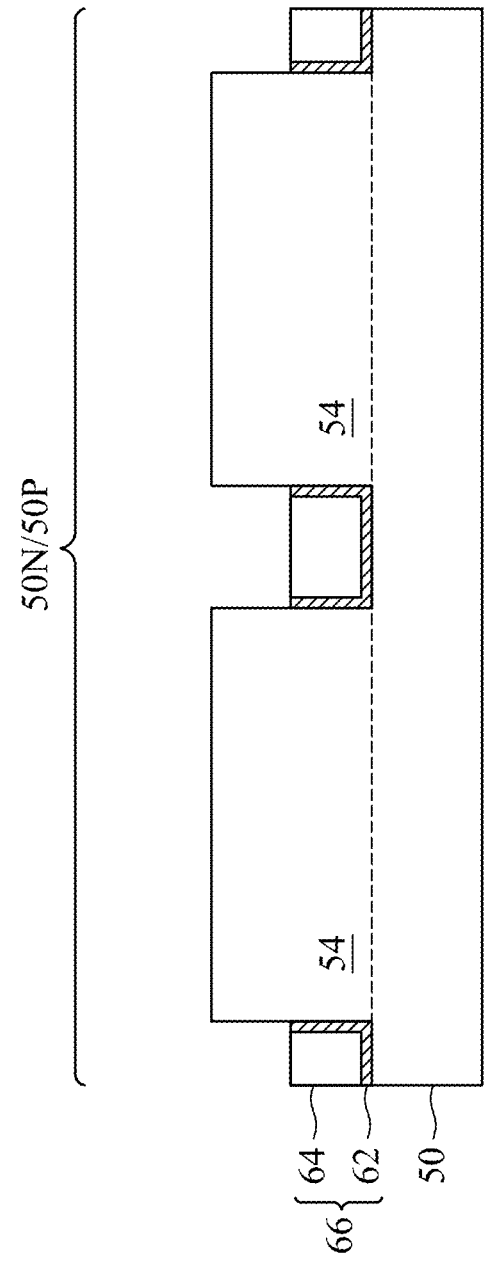
Figure 7:
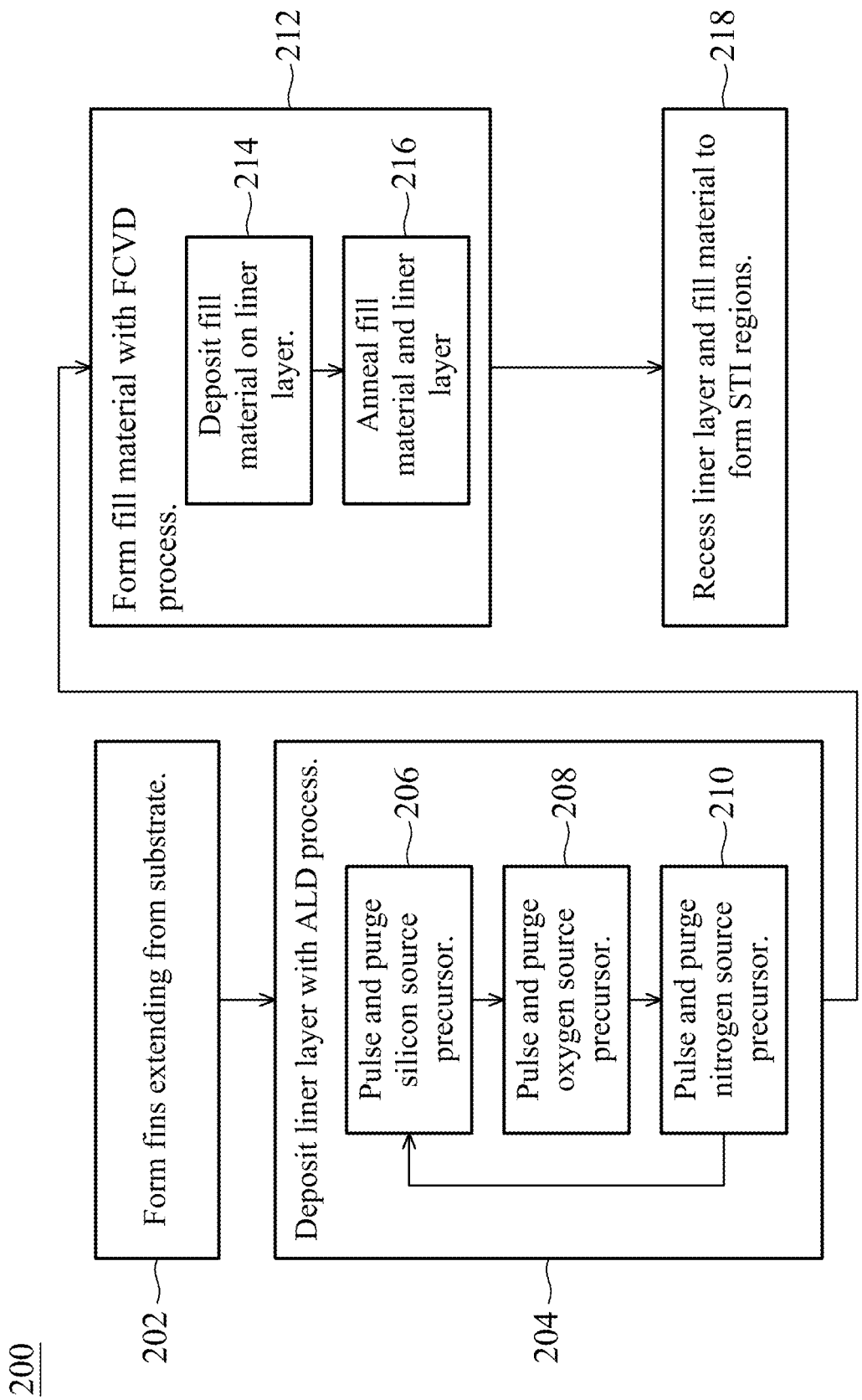
FIG. 7 is a flow chart of an example method for forming fins and shallow trench isolation (STI) regions, in accordance with some embodiments.

In FIGS. 6A and 6B and step 218 of the method 200, the liner layer 62 and the fill material 64 are recessed to form STI regions 66 between the fins 54. The liner layer 62 and the fill material 64 may be recessed by planarization, etching, combinations thereof, or the like. For example, the liner layer 62 and the fill material 64 can be planarized and then subsequently etched.

The liner layer 62 and the fill material 64 can first be planarized. Excess portions of the liner layer 62 and the fill material 64 over the fins 54 are thus removed. In some embodiments, a planarization process such as a chemical mechanical polish (CMP), an etch-back process, combinations thereof, or the like may be utilized. The planarization process exposes the fins 54 such that top surfaces of the fins 54, the liner layer 62, and the fill material 64 are coplanar (within process variations) after the planarization process is complete. In embodiments where the masks 56 remain on the fins 54, the planarization process may expose the masks 56 or remove the masks 56 such that top surfaces of the masks 56 or the fins 54, respectively, the liner layer 62, and the fill material 64 are coplanar (within process variations) after the planarization process is complete.

After planarization, the liner layer 62 and the fill material 64 can be etched to form the STI regions 66. The liner layer 62 and the fill material 64 are thus recessed such that upper portions of fins 54 in the n-type region 50N and in the p-type region 50P protrude from between neighboring STI regions 66. Further, the top surfaces of the STI regions 66 may have a flat surface as illustrated, a convex surface, a concave surface (such as dishing), or a combination thereof. The top surfaces of the STI regions 66 may be formed flat, convex, and/or concave by an appropriate etch. The STI regions 66 may be etched using an acceptable etching process, such as one that is selective to the material of the liner layer 62 and the fill material 64 (e.g., etches the materials of the liner layer 62 and the fill material 64 at a faster rate than the material of the fins 54). For example, a wet etch using, for example, dilute hydrofluoric (dHF) acid may be used. As noted above, the final nitrogen concentration of the liner layer 62 is sufficiently low that the liner layer 62 has a similar etch rate as the fill material 64, relative the etching process used to recess the STI regions 66. For example, in some embodiments, the etching process used to recess the STI regions 66 removes the material(s) of the liner layer 62 and the fill material 64 at substantially the same rate. As such, after the STI regions 66 are formed, top surfaces of the liner layer 62 and the fill material 64 are coplanar (within process variations). Each of the resulting STI regions 66 includes a liner or liner layer (comprising a recessed portion of the liner layer 62) and a main layer (comprising a recessed portion of the fill material 64).

The process described with respect to FIGS. 2A through 6B is just one example of how the fins 54 may be formed. In some embodiments, the fins 54 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 54. Additionally, in some embodiments, heteroepitaxial structures can be used for the fins 54. For example, before the STI regions 66 are fully recessed (e.g., after the planarizing but before the etching), the fins 54 can be recessed, and a material different from the fins 54 may be epitaxially grown over the recessed fins 54. In such embodiments, the fins 54 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 54. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 54 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 54 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 54 and the STI regions 66 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 54 and the STI regions 66 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 8:
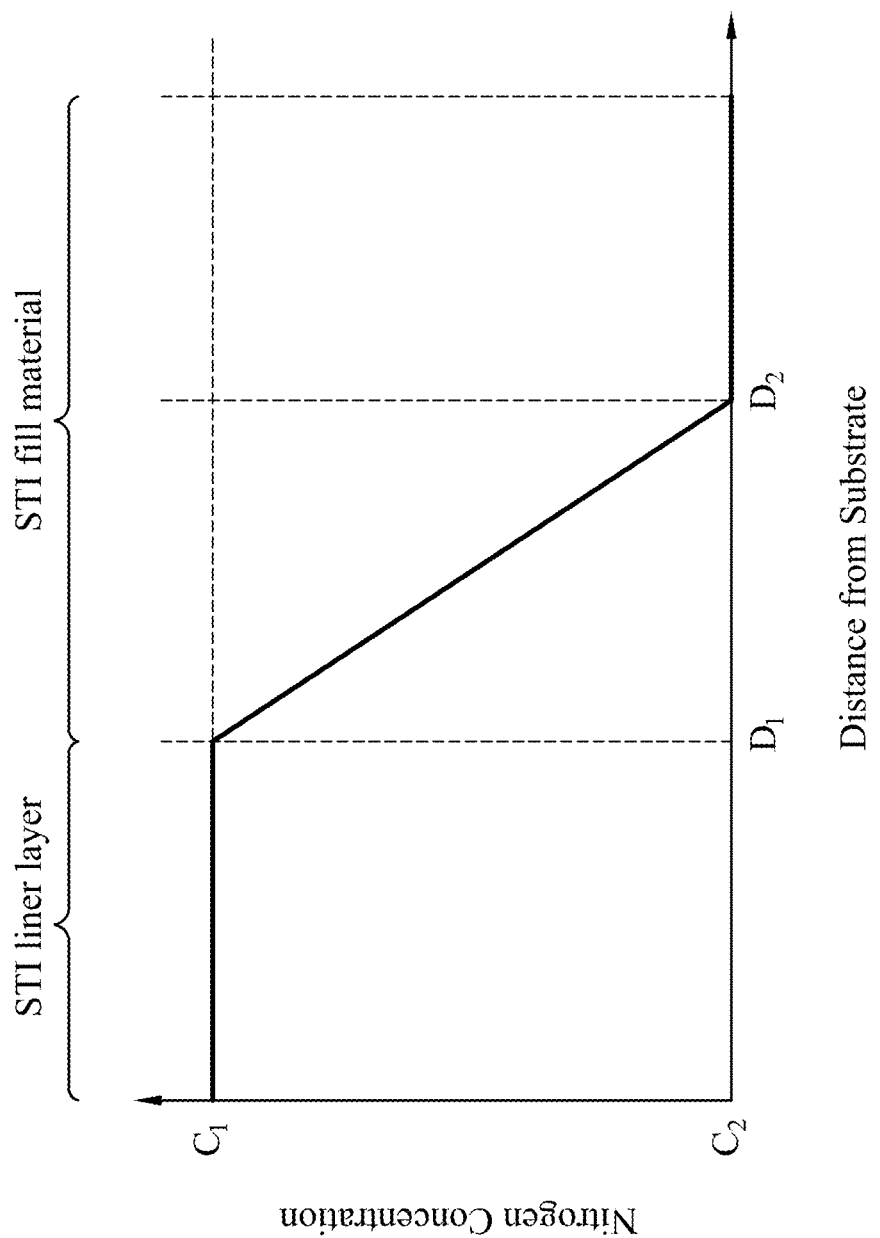
FIG. 8 is a graph illustrating the nitrogen concentration of STI regions, in accordance with some embodiments.

FIG. 8 is a graph illustrating the nitrogen concentration of the STI regions 66 at different distances from the substrate 50, in accordance with some embodiments. As shown, the concentration is constant through the liner layer 62 at a first concentration $C_1$ to a first distance D1. The first concentration $C_1$ is the final nitrogen concentration of the liner layer 62 discussed above (e.g., in the range of about 1% to about 5%). The first distance $D_1$ is the final thickness $T_2$ of the liner layer 62 discussed above (e.g., in the range of about 1 Å to about 10 Å). Some of the nitrogen removed from the liner layer 62 during annealing is diffused into the fill material 64 proximate the interface of the liner layer 62 and the fill material 64. As such, the nitrogen concentration decreases (e.g., has a negative gradient) through the fill material 64 to a second concentration $C_2$ at a second distance $D_2$. The second concentration $C_2$ can be about zero. The second distance $D_2$ can be in the range of about 10 Å to about 60 Å.

FIGS. 9A through 15B are cross-sectional views of further intermediate stages in the manufacturing of FinFETs, in accordance with some embodiments. FIGS. 9A, 10A, 11A, 12A, 13A, 14A, and 15A illustrate reference cross-section A-A illustrated in FIG. 1, and show multiple fins 54. FIGS. 9B, 10B, 11B, 12B, 13B, 14B, and 15B illustrate reference cross-section B-B illustrated in FIG. 1, except for a single fin 54. FIGS. 9C and 9D illustrate reference cross-section C-C illustrated in FIG. 1, and show multiple fins 54. FIGS. 9A through 15B illustrate features in either of the n-type region 50N and the p-type region 50P. For example, the structures illustrated in FIGS. 9A through 15B may be applicable to both the n-type region 50N and the p-type region 50P, and differences (if any) in the structures of the n-type region 50N and the p-type region 50P are described in the text accompanying each figure.

Figure 9A:
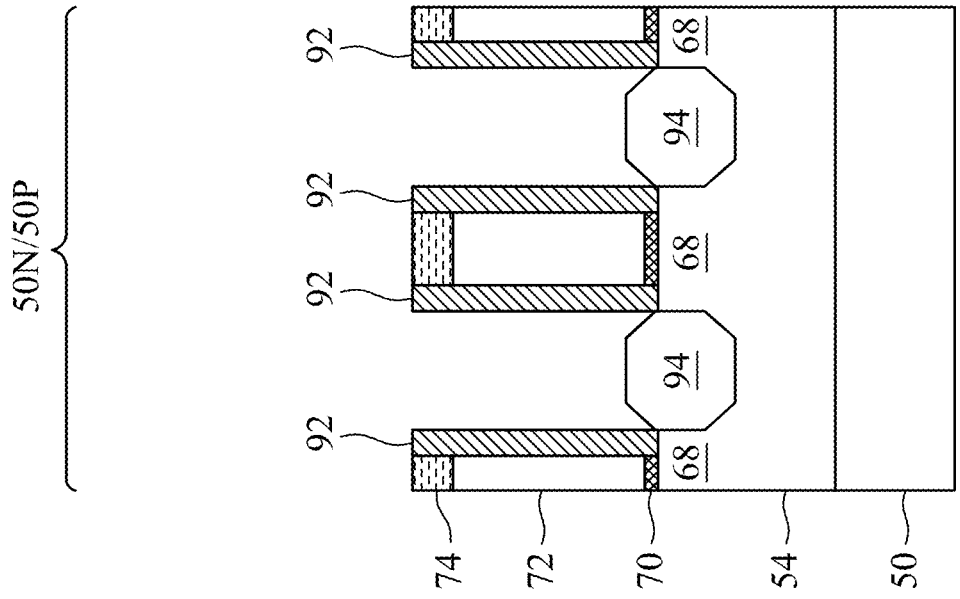
FIGS. 9A, 9B, 9C, 9D, 10A, 10B, 11A, 11B, 12A, 12B, 13A, 13B, 14A, 14B, 15A, and 15B are cross-sectional views of further intermediate stages in the manufacturing of FinFETs, in accordance with some embodiments.
Figure 9B:
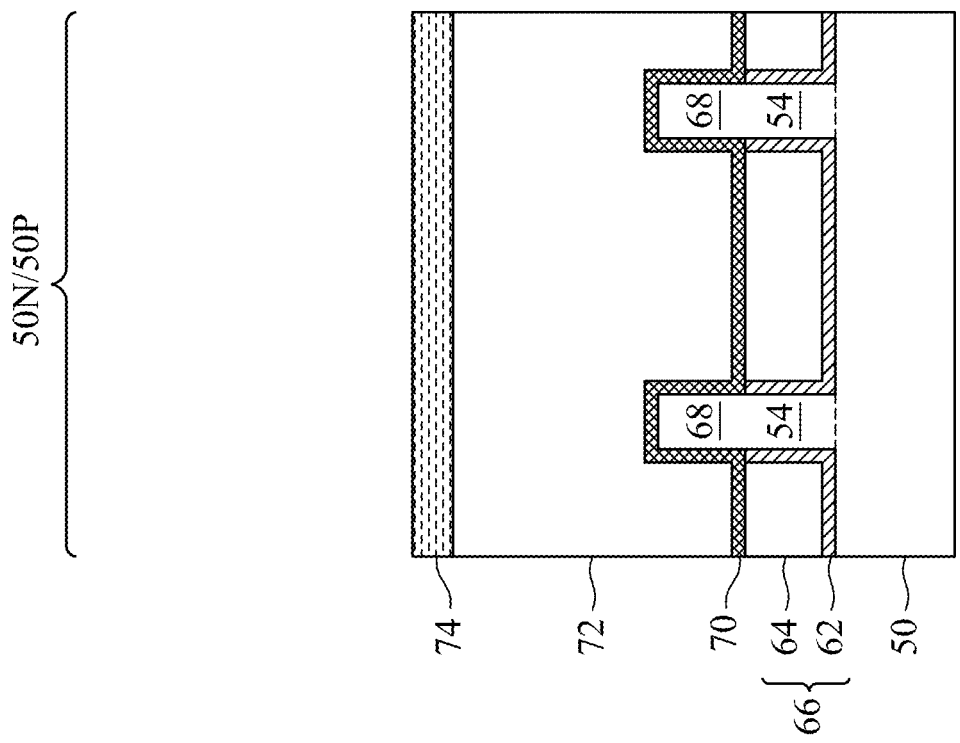

In FIGS. 9A and 9B, dummy dielectrics 70 are formed over the fins 54 and dummy gates 72 are formed over the dummy dielectrics 70. The dummy gates 72 extend along sidewalls and top surfaces of the fins 54. As an example of forming the dummy dielectrics 70 and the dummy gates 72, a dummy dielectric layer is formed on the fins 54. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the n-type region 50N and the p-type region 50P. It is noted that the dummy dielectric layer is shown covering only the fins 54 for illustrative purposes only. In some embodiments, the dummy dielectric layer may be deposited such that the dummy dielectric layer covers the STI regions 66, extending between the dummy gate layer and the STI regions 66. The mask layer is then patterned using acceptable photolithography and etching techniques to form masks 74. The pattern of the masks 74 is then transferred to the dummy gate layer by an acceptable etching technique to form dummy gates 72. In some embodiments, the pattern of the masks 74 is further transferred to the dummy dielectric layer to form dummy dielectrics 70. The dummy gates 72 cover respective channel regions 68 of the fins 54. The pattern of the masks 74 may be used to physically separate each of the dummy gates 72 from adjacent dummy gates. The dummy gates 72 may also have a lengthwise direction substantially perpendicular to the lengthwise direction of the fins 54.

Gate spacers 92 are formed on exposed surfaces of the dummy gates 72, the masks 74, and/or the fins 54. The gate spacers 92 may be formed by conformally forming an insulating material and subsequently etching the insulating material. The insulating material of the gate spacers 92 may be silicon nitride, silicon carbonitride, silicon oxycarbonitride, a combination thereof, or the like, and may be formed by thermal oxidation, deposition, a combination thereof, or the like. In some embodiments, the gate spacers 92 are formed from a multi-layered insulating material, and include multiple layers. For example, the gate spacers 92 may include multiple layers of silicon carbonitride, may include multiple layers of silicon oxycarbonitride, or may include a layer of silicon oxide disposed between two layers of silicon nitride. The etching of the gate spacers 92 can be anisotropic. After etching, the gate spacers 92 can have straight sidewalls or curved sidewalls.

Before or during the formation of the gate spacers 92, implants for lightly doped source/drain (LDD) regions may be performed. In the embodiments with different device types, similar to the implants discussed above in FIG. 8, a mask, such as a photoresist, may be formed over the n-type region 50N, while exposing the p-type region 50P, and appropriate type (e.g., p-type) impurities may be implanted into the exposed fins 54 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 54 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities.

Epitaxial source/drain regions 94 are formed in the fins 54. The epitaxial source/drain regions 94 are formed in the fins 54 such that each dummy gate 72 is disposed between respective neighboring pairs of the epitaxial source/drain regions 94. In some embodiments the epitaxial source/drain regions 94 may extend into, and may also penetrate through, the fins 54. In some embodiments, the gate spacers 92 are used to separate the epitaxial source/drain regions 94 from the dummy gates 72 by an appropriate lateral distance so that the epitaxial source/drain regions 94 do not short out subsequently formed gates of the resulting FinFETs. A material of the epitaxial source/drain regions 94 may be selected to exert stress in the respective channel regions 68, thereby improving performance.

The epitaxial source/drain regions 94 in the n-type region 50N may be formed by masking the p-type region 50P and etching source/drain regions of the fins 54 in the n-type region 50N to form recesses in the fins 54. Then, the epitaxial source/drain regions 94 in the n-type region 50N are epitaxially grown in the recesses. The epitaxial source/drain regions 94 may include any acceptable material, such as appropriate for n-type FinFETs. For example, if the fins 54 are silicon, the epitaxial source/drain regions 94 in the n-type region 50N may include materials exerting a tensile strain in the channel region 68, such as silicon, silicon carbide, phosphorous doped silicon carbide, silicon phosphide, or the like. The epitaxial source/drain regions 94 in the n-type region 50N may have surfaces raised from respective surfaces of the fins 54 and may have facets.

The epitaxial source/drain regions 94 in the p-type region 50P may be formed by masking the n-type region 50N and etching source/drain regions of the fins 54 in the p-type region 50P to form recesses in the fins 54. Then, the epitaxial source/drain regions 94 in the p-type region 50P are epitaxially grown in the recesses. The epitaxial source/drain regions 94 may include any acceptable material, such as appropriate for p-type FinFETs. For example, if the fins 54 are silicon, the epitaxial source/drain regions 94 in the p-type region 50P may comprise materials exerting a compressive strain in the channel region 68, such as silicon-germanium, boron doped silicon-germanium, germanium, germanium tin, or the like. The epitaxial source/drain regions 94 in the p-type region 50P may have surfaces raised from respective surfaces of the fins 54 and may have facets.

The epitaxial source/drain regions 94 and/or the fins 54 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 94 may be in situ doped during growth.

Figure 9C:
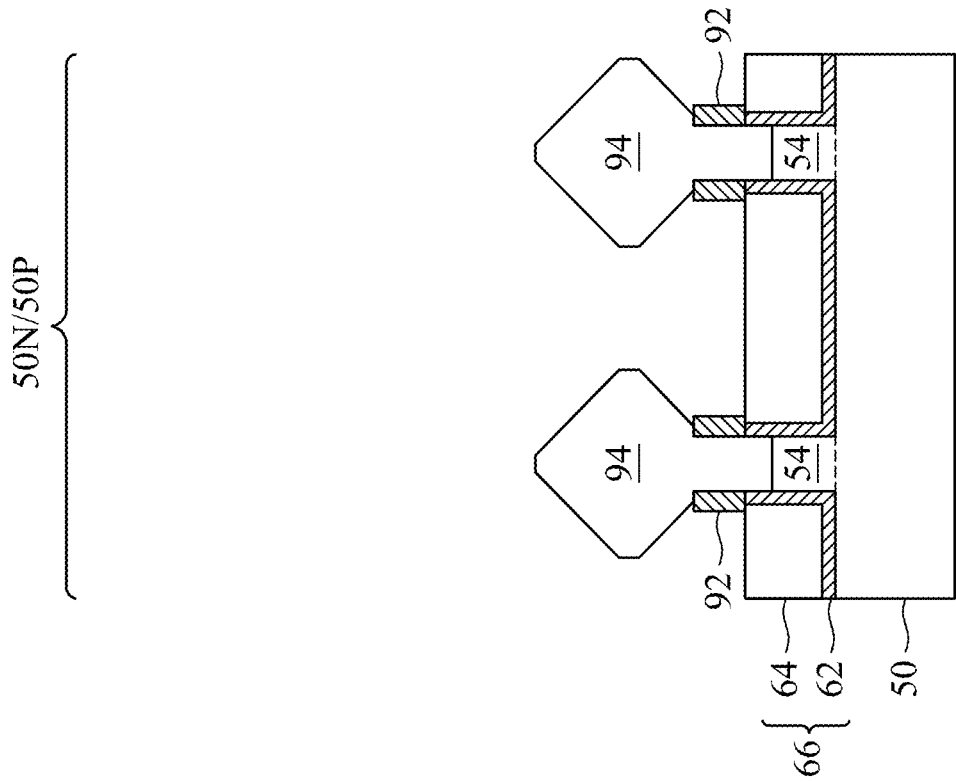
Figure 9D:
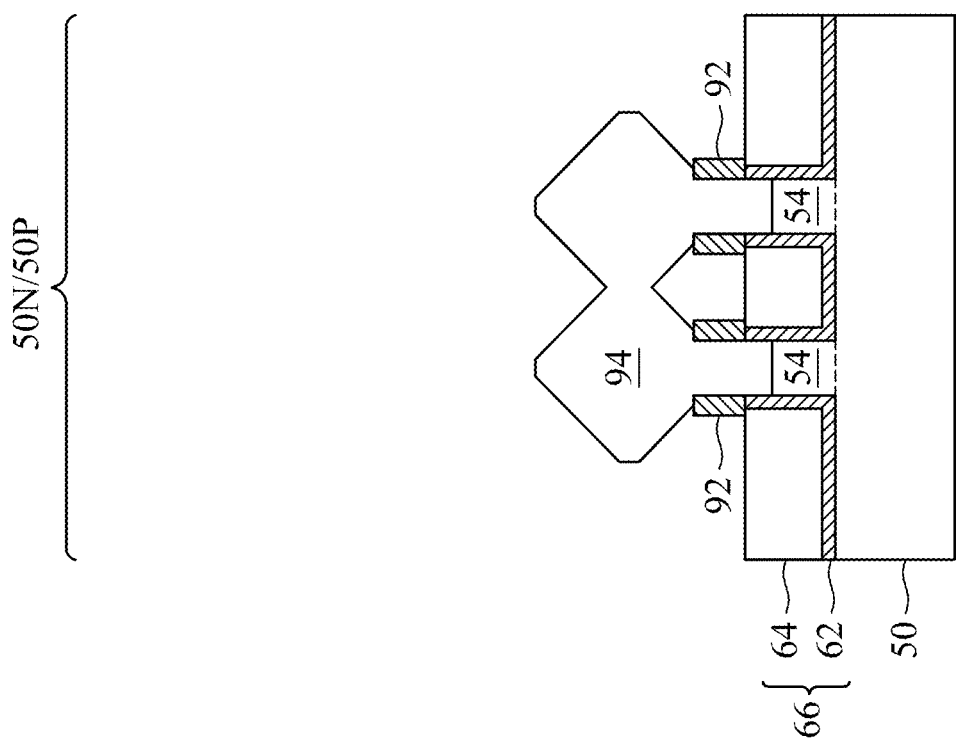

As a result of the epitaxy processes used to form the epitaxial source/drain regions 94 in the n-type region 50N and the p-type region 50P, upper surfaces of the epitaxial source/drain regions have facets which expand laterally outward beyond sidewalls of the fins 54. In some embodiments, these facets cause adjacent epitaxial source/drain regions 94 of a same FinFET to merge as illustrated by FIG. 9C. In some embodiments, adjacent epitaxial source/drain regions 94 remain separated after the epitaxy process is completed as illustrated by FIG. 9D. In the embodiments illustrated in FIGS. 9C and 9D, the gate spacers 92 are formed covering a portion of the sidewalls of the fins 54 that extend above the STI regions 66 thereby blocking the epitaxial growth. In some other embodiments, the spacer etch used to form the gate spacers 92 may be adjusted to remove the spacer material to allow the epitaxially grown region to extend to the surface of the STI regions 66.

It is noted that the above disclosure generally describes a process of forming spacers, LDD regions, and source/drain regions. Other processes and sequences may be used. For example, fewer or additional spacers may be utilized, different sequence of steps may be utilized (e.g., spacers may be formed and removed), and/or the like. Furthermore, the n-type and p-type devices may be formed using a different structures and steps.

Figure 10B:
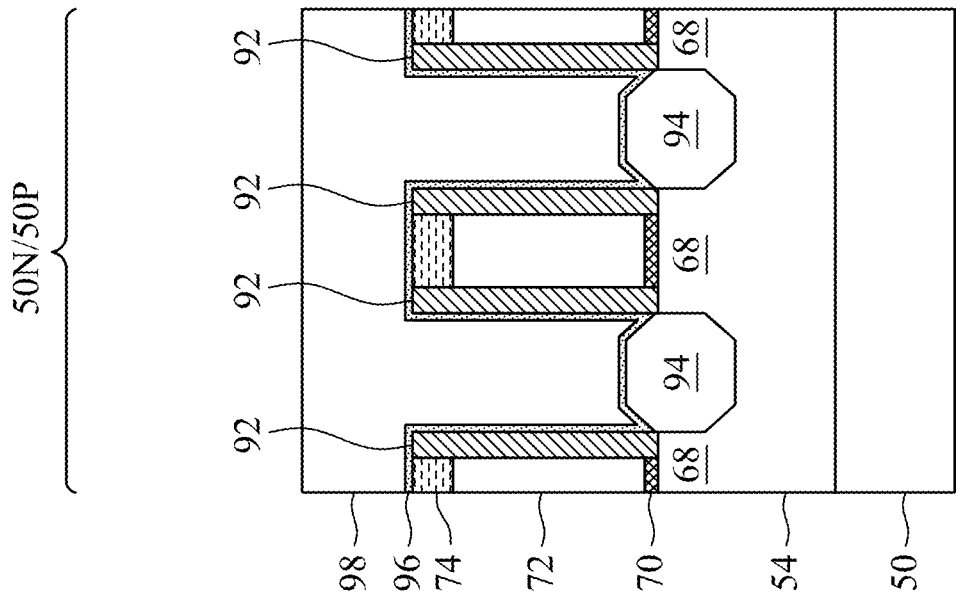
Figure 10A:
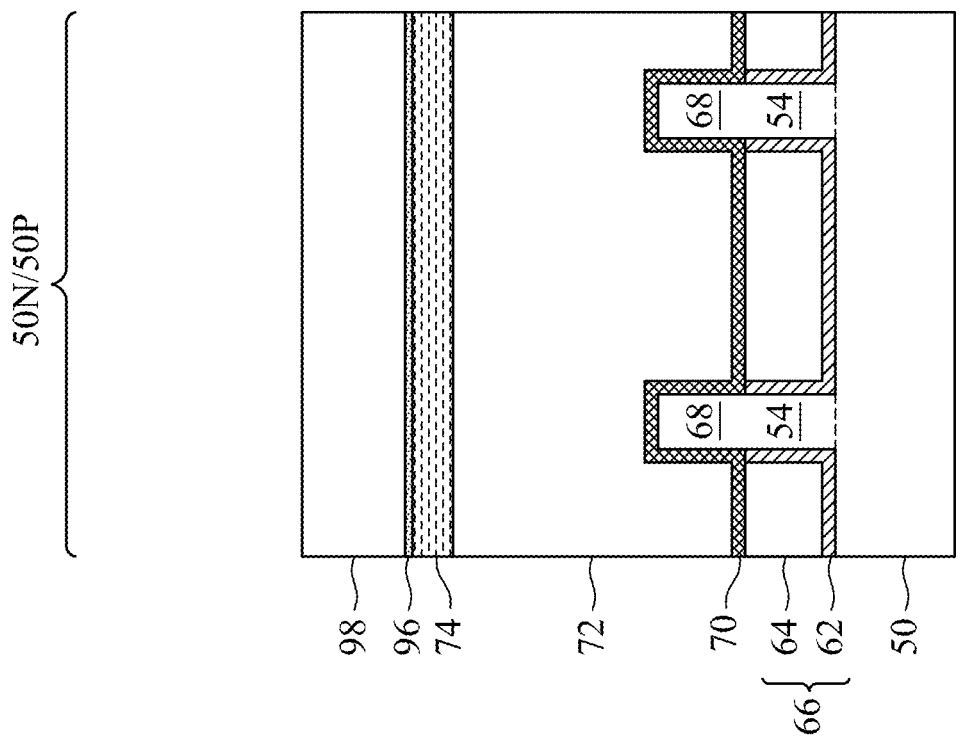

In FIGS. 10A and 10B, a first ILD layer 98 is deposited over the masks 74 (if present) or the dummy gates 72, the epitaxial source/drain regions 94, and the gate spacers 92. The first ILD layer 98 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 96 is disposed between the first ILD layer 98 and the epitaxial source/drain regions 94, the masks 74 (if present) or the dummy gates 72, and the gate spacers 92. The CESL 96 may be formed of a dielectric material, such as, silicon nitride, silicon oxide, silicon oxynitride, or the like, that has a high etching selectivity from the etching of the first ILD layer 98.

Figure 11B:
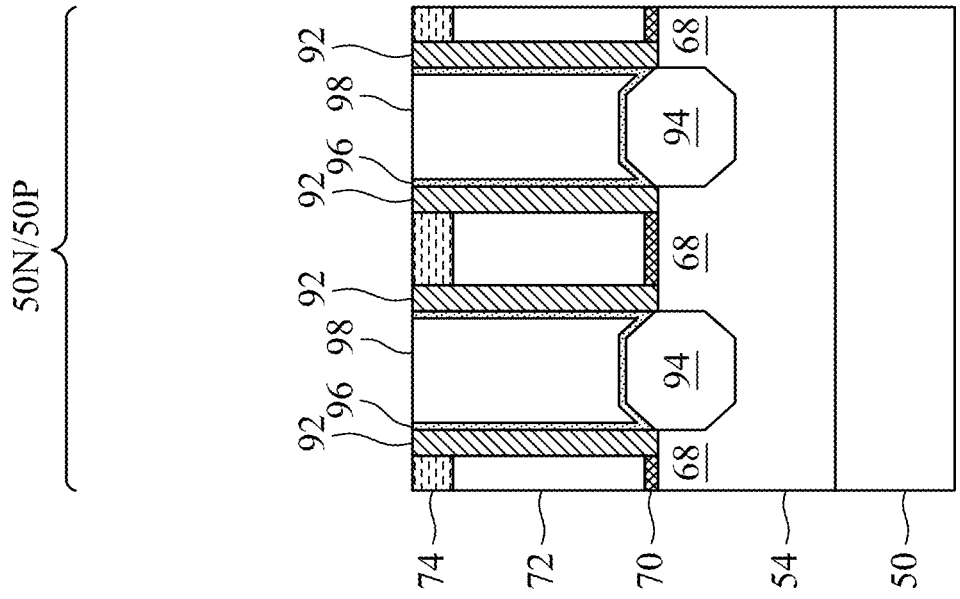
Figure 11A:
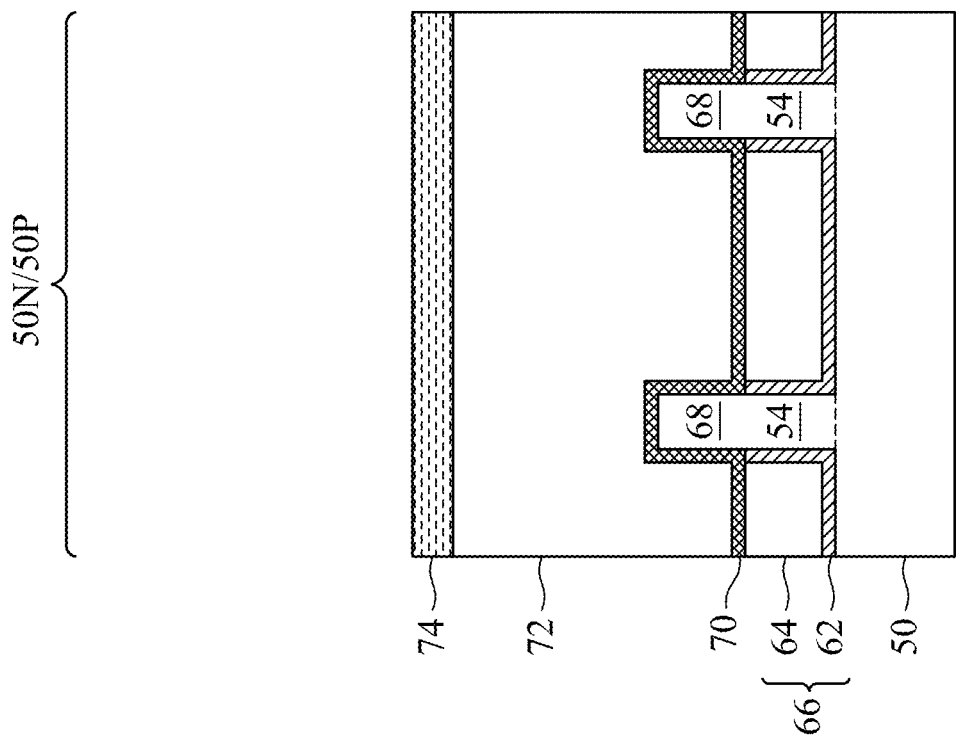

In FIGS. 11A and 11B, a planarization process, such as a CMP, may be performed to level the top surface of first ILD layer 98 with the top surfaces of the masks 74 (if present) or the dummy gates 72. The planarization process may also remove the masks 74 on the dummy gates 72, and portions of the gate spacers 92 along sidewalls of the masks 74. The planarization process can also remove portions of the CESL 96 over the gate spacers 92 and the masks 74 (if present) or the dummy gates 72. After the planarization process, top surfaces of the first ILD layer 98, the gate spacers 92, and the masks 74 (if present) or the dummy gates 72 are coplanar (within process variations). Accordingly, the top surfaces of the masks 74 (if present) or the dummy gates 72 are exposed through the first ILD layer 98. In the illustrated embodiment, the masks 74 remain, in which case the planarization process levels the top surface of the first ILD layer 98 with the top surfaces of the masks 74. In another embodiment, the masks 74 are removed, in which case the planarization process levels the top surface of the first ILD layer 98 with the top surfaces of the dummy gates 72.

Figure 12B:
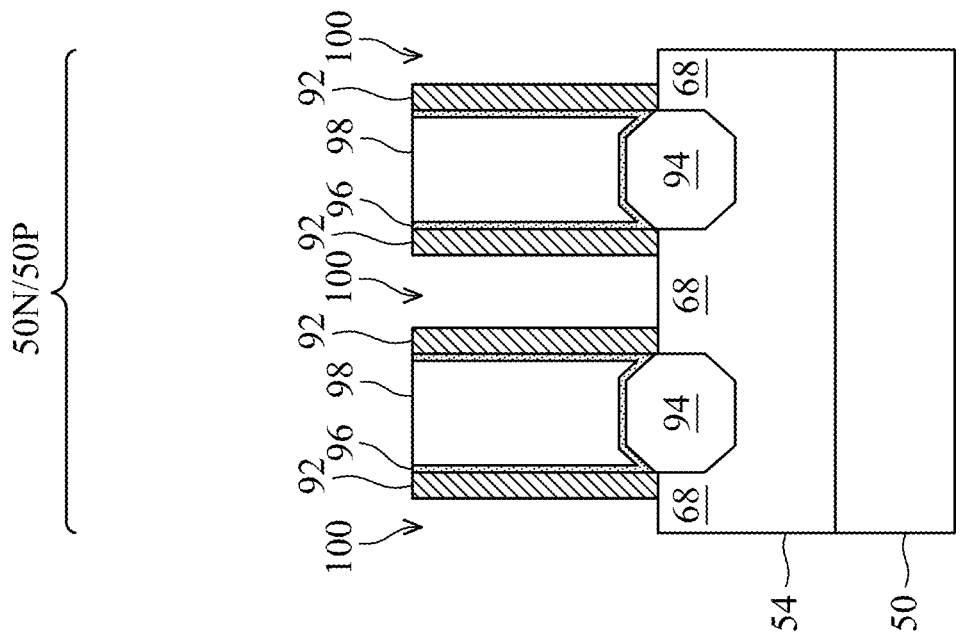
Figure 12A:
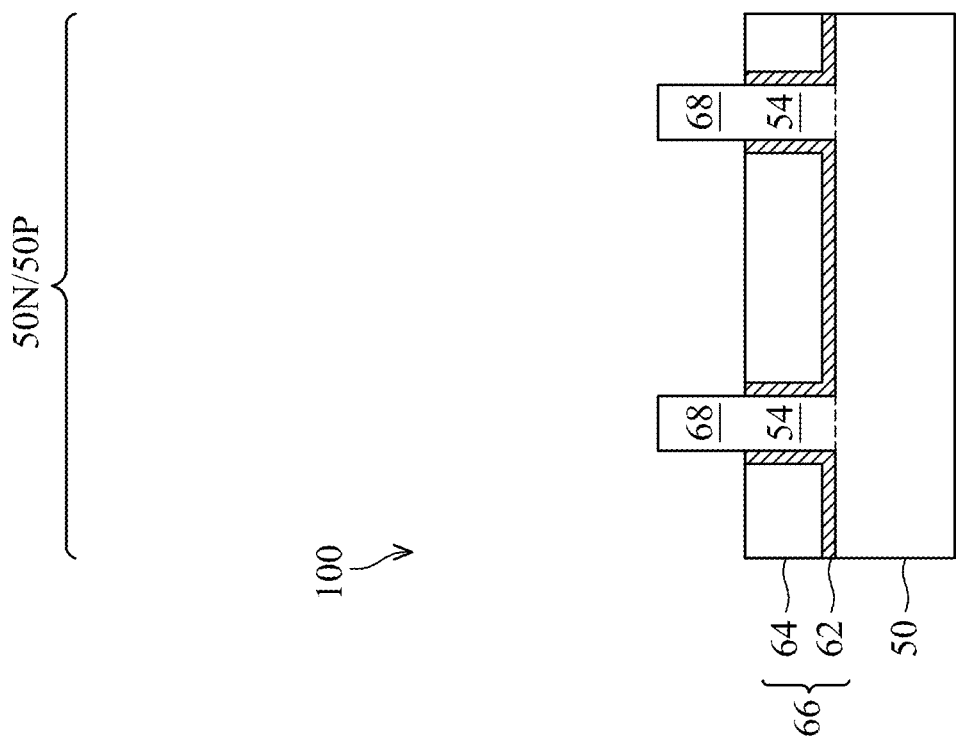

In FIGS. 12A and 12B, the masks 74 (if present) and the dummy gates 72 are removed in an etching step(s), so that recesses 100 are formed. Portions of the dummy dielectrics 70 in the recesses 100 may also be removed. In some embodiments, the dummy gates 72 are removed and the dummy dielectrics 70 remain and are exposed by the recesses 100. In some embodiments, the dummy dielectrics 70 are removed from recesses 100 in a first region of a die (e.g., a core logic region) and remain in recesses 100 in a second region of the die (e.g., an input/output region). In some embodiments, the masks 74 and the dummy gates 72 are removed by an anisotropic dry etch process. For example, the etching process may include a dry etch process using reaction gas(es) that selectively etch the materials of the masks 74 and the dummy gates 72 at a faster rate than the materials of the first ILD layer 98 and the gate spacers 92. Each recess 100 exposes and/or overlies a channel region 68 of a respective fin 54. Each channel region 68 is disposed between neighboring pairs of the epitaxial source/drain regions 94. During the removal, the dummy dielectrics 70 may be used as etch stop layers when the dummy gates 72 are etched. The dummy dielectrics 70 may then be optionally removed after the removal of the dummy gates 72.

Figure 13B:
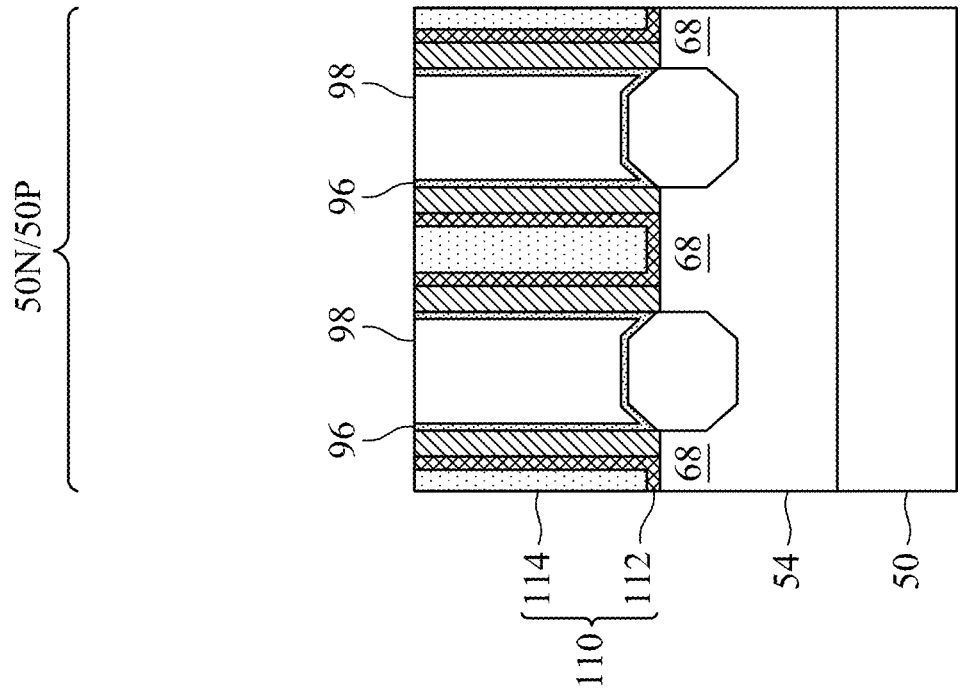
Figure 13A:
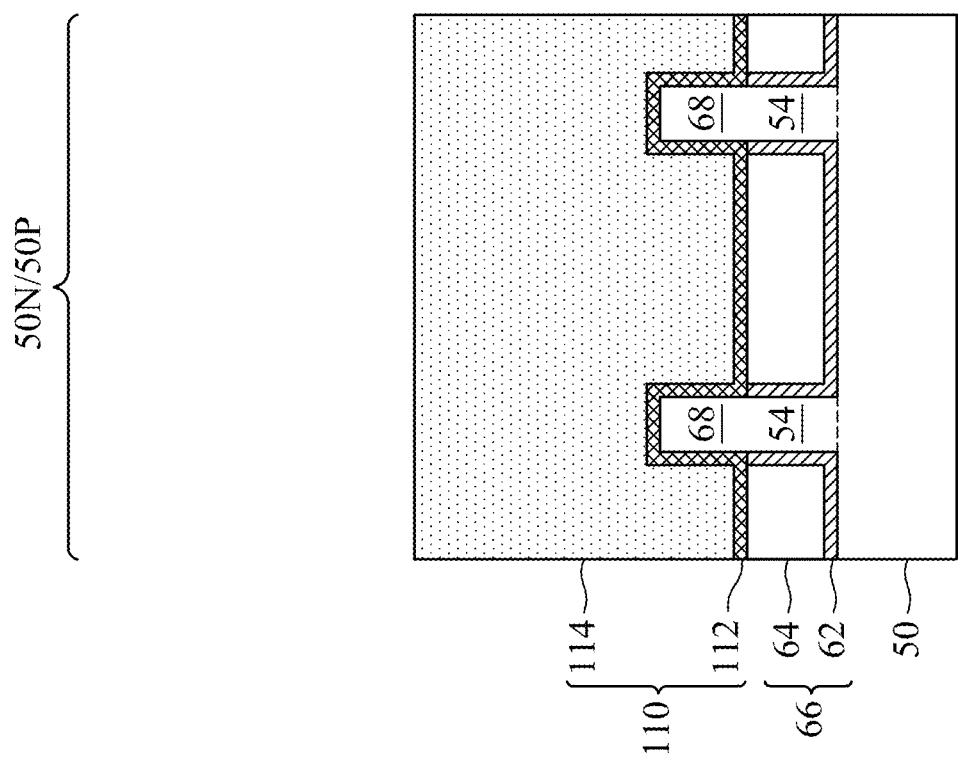

In FIGS. 13A and 13B, gate dielectrics 112 and gate electrodes 114 are formed for replacement gates. Gate dielectrics 112 are deposited in the recesses 100, such as on the top surfaces and the sidewalls of the fins 54 and on sidewalls of the gate spacers 92. The gate dielectrics 112 may also be formed on the top surface of the first ILD layer 98. In some embodiments, the gate dielectrics 112 comprise one or more dielectric layers, such as one or more layers of silicon oxide, silicon nitride, metal oxide, metal silicate, or the like. For example, in some embodiments, the gate dielectrics 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 112 may include a dielectric layer having a k value greater than about 7.0. The formation methods of the gate dielectrics 112 may include Molecular-Beam Deposition (MBD), ALD, PECVD, and the like. In embodiments where portions of the dummy dielectrics 70 remain in the recesses 100, the gate dielectrics 112 include a material of the dummy dielectrics 70 (e.g., silicon oxide).

As noted above, the gate dielectrics 112 can include an interfacial layer of silicon oxide. The interfaces of the gate dielectrics 112 and the substrate 50 (e.g., each of the fins 54) can have an effective oxide charge ($Q_{eff}$) of down to about $2.9 \times 10^{11}$ coulombs. As noted above, the liner layer 62 has good electrical performance after the wet anneal process (discussed above with respect to FIGS. 5A and 5B). In some embodiments, the liner layer 62 has a lesser effective oxide charge than the gate dielectrics 112 with respect to the substrate 50. In other words, the interface of the liner layer 62 and the substrate 50 can have a lesser effective oxide charge ($Q_{eff}$) than the interfaces of the gate dielectrics 112 and the substrate 50.

The gate electrodes 114 are deposited over the gate dielectrics 112, respectively, and fill the remaining portions of the recesses 100. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 114 are illustrated, the gate electrodes 114 may comprise any number of liner layers, any number of work function tuning layers, and a fill material. After the filling of the recesses 100, a planarization process, such as a CMP, may be performed to remove the excess portions of the gate dielectrics 112 and the material of the gate electrodes 114, which excess portions are over the top surface of the first ILD layer 98. The remaining portions of the material(s) of the gate dielectrics 112 and the gate electrodes 114 thus form replacement gates of the resulting FinFETs. The gate dielectrics 112 and the gate electrodes 114 may be collectively referred to as gate structures 110 or "gate stacks." The gate structures 110 extend along sidewalls of the channel regions 68 of the fins 54.

The formation of the gate dielectrics 112 in the n-type region 50N and the p-type region 50P may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

Figure 14A:
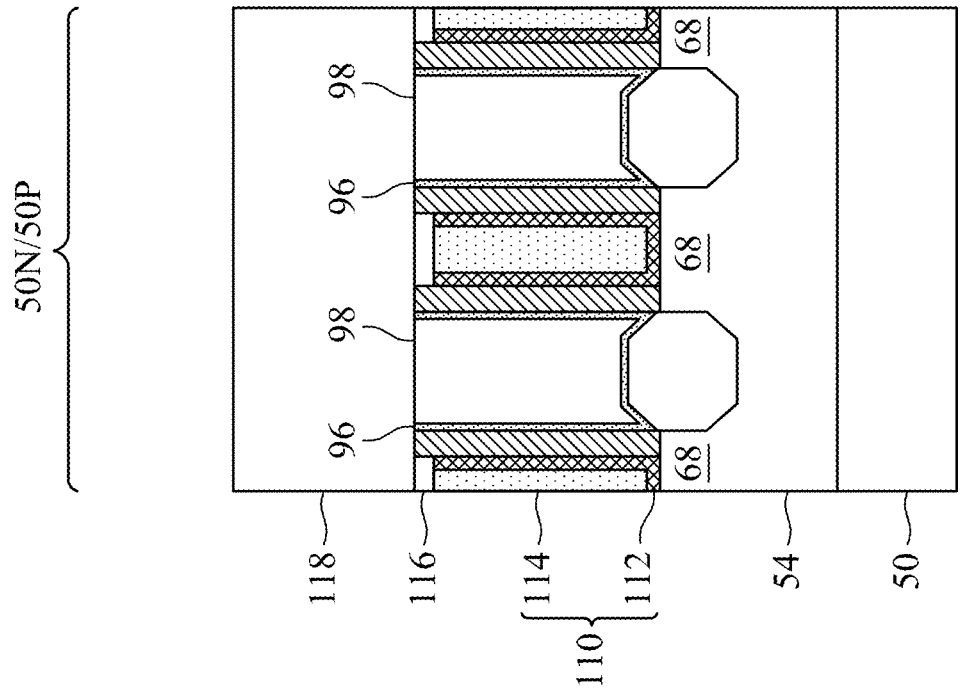
Figure 14B:
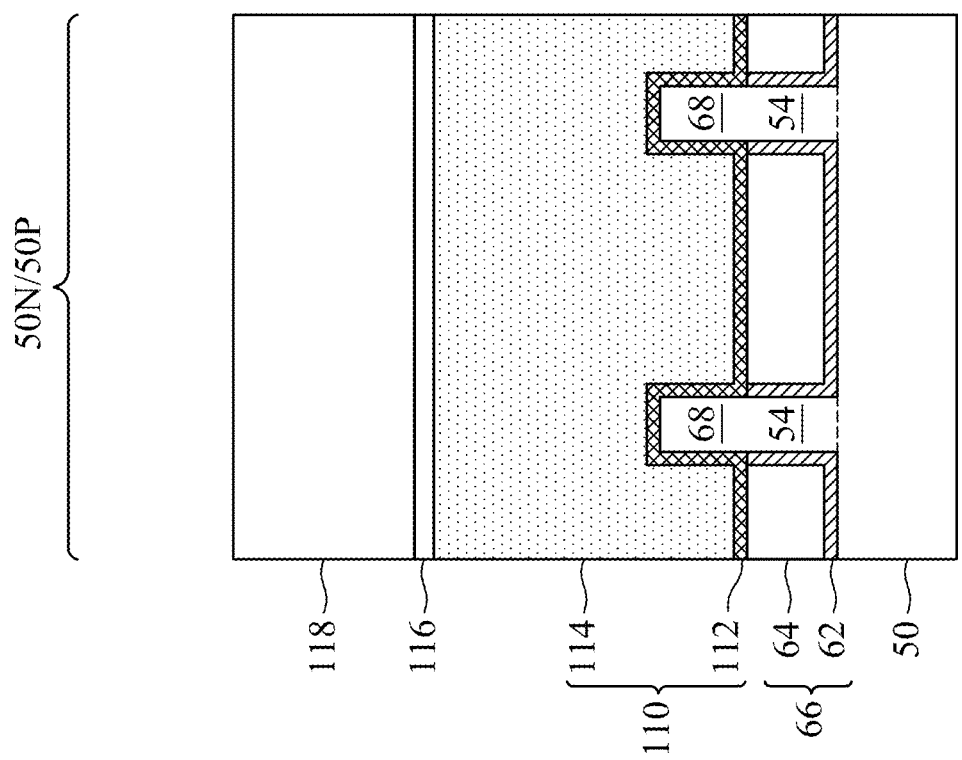

In FIGS. 14A and 14B, a second ILD layer 118 is deposited over the first ILD layer 98. In some embodiments, the second ILD layer 118 is a flowable film formed by a flowable CVD method. In some embodiments, the second ILD layer 118 is formed of a dielectric material such as PSG, BSG, BPSG, USG, or the like, and may be deposited by any suitable method, such as CVD and PECVD. In some embodiments, an etch stop layer is formed between the first ILD layer 98 and the second ILD layer 118.

In some embodiments, gate masks 116 are formed over respective gate stacks (including a gate dielectric 112 and a corresponding gate electrode 114) before forming the second ILD layer 118. The gate masks 116 are disposed between opposing pairs of the gate spacers 92. In some embodiments, forming the gate masks 116 includes recessing the gate dielectrics 112 and the gate electrodes 114 so that recesses are formed between opposing pairs of the gate spacers 92. One or more layers of dielectric material, such as silicon nitride, silicon oxynitride, or the like, are filled in the recesses, and a planarization process is performed to remove excess portions of the dielectric material extending over the first ILD layer 98. The gate masks 116 comprise the remaining portions of the dielectric material in the recesses. Subsequently formed gate contacts penetrate through the second ILD layer 118 and the gate masks 116 to contact the top surfaces of the recessed gate electrodes 114.

Figure 15A:
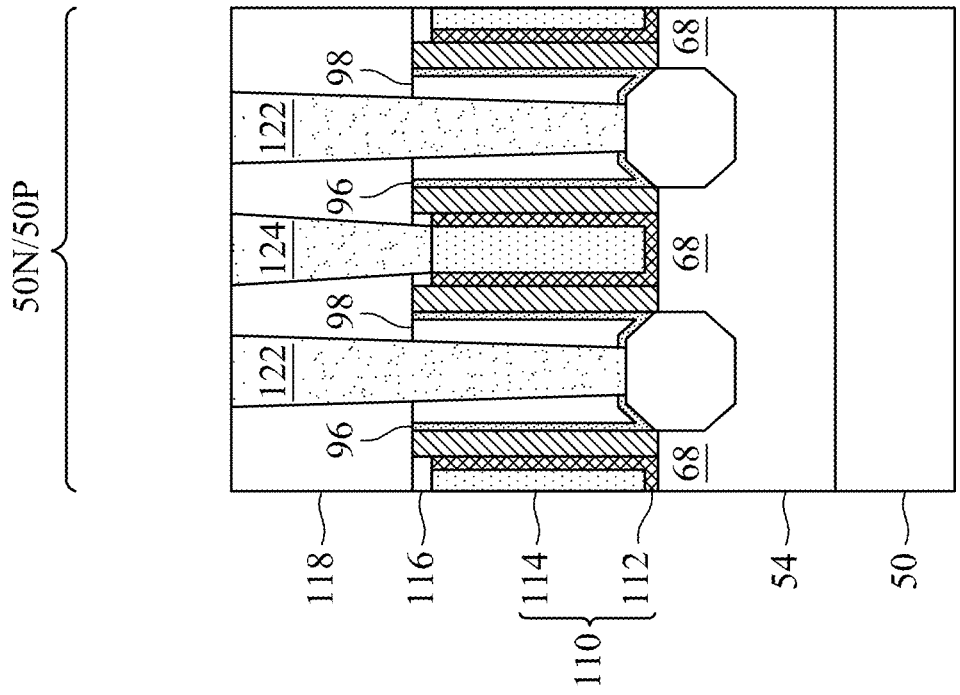
Figure 15B:
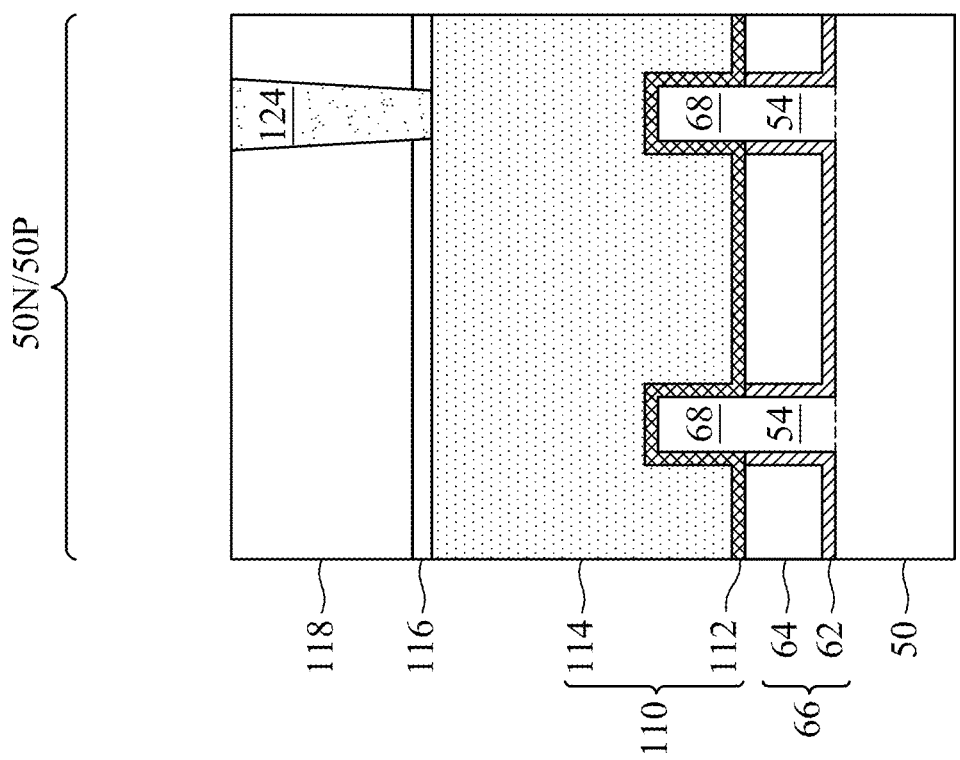

In FIGS. 15A and 15B, source/drain contacts 122 and gate contacts 124 are formed, respectively, to the epitaxial source/drain regions 94 and the gate electrodes 114. Openings for the source/drain contacts 122 are formed through the second ILD layer 118, the first ILD layer 98, and the CESL 96. Openings for the gate contacts 124 are formed through the second ILD layer 118 and the gate masks 116. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the second ILD layer 118. The remaining liner and conductive material form the source/drain contacts 122 and the gate contacts 124 in the openings. An anneal process may be performed to form a silicide at the interface between the epitaxial source/drain regions 94 and the source/drain contacts 122. The source/drain contacts 122 are physically and electrically coupled to the epitaxial source/drain regions 94, and the gate contacts 124 are physically and electrically coupled to the gate electrodes 114. The source/drain contacts 122 and the gate contacts 124 may be formed in different processes, or may be formed in the same process. Although shown as being formed in the same cross-sections, it should be appreciated that each of the source/drain contacts 122 and the gate contacts 124 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 16:
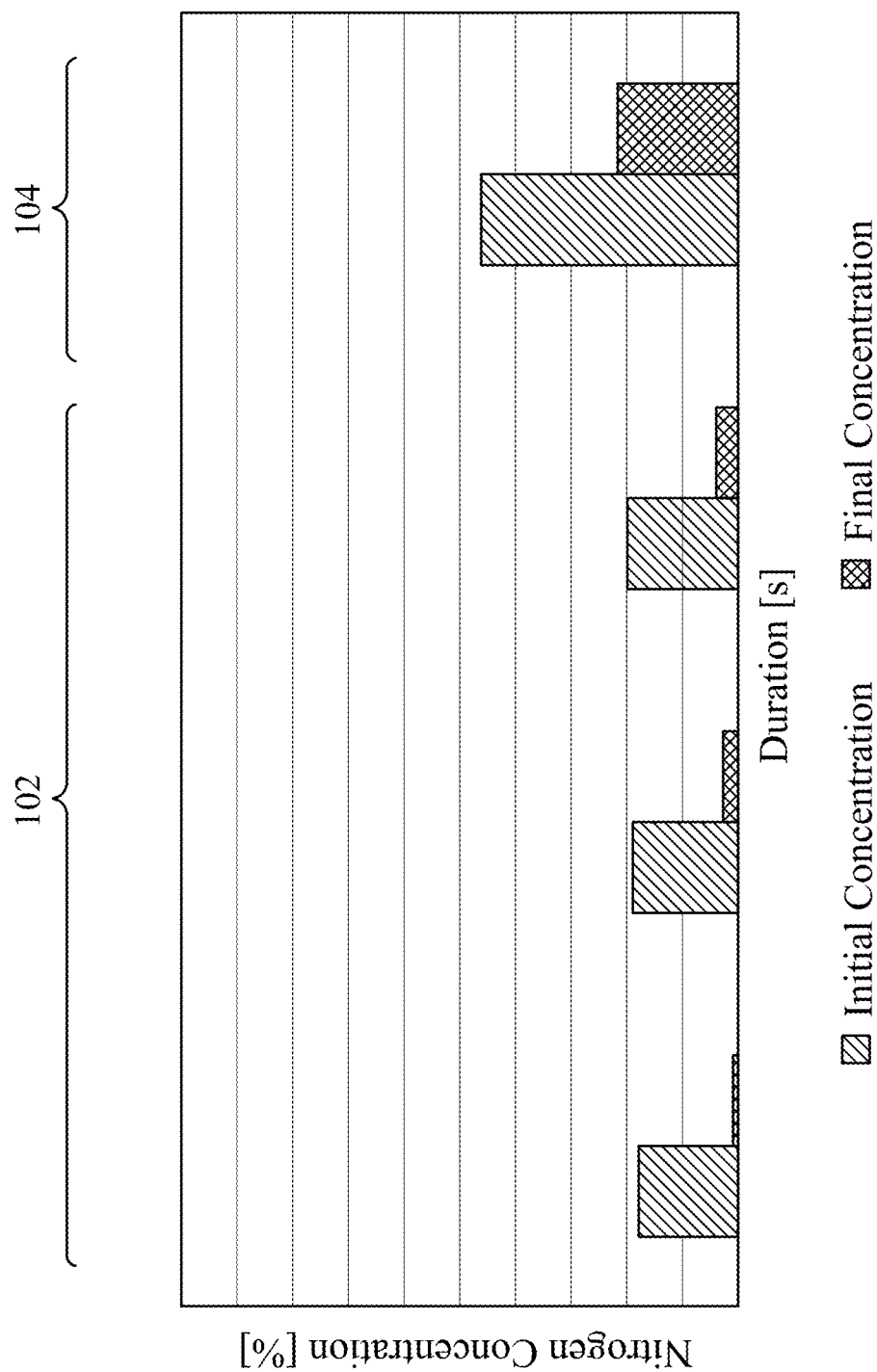
FIG. 16 is chart of experimental data from different processes for forming STI regions.

When forming the liner layer 62, performing the pulses of the ALD process at the temperatures discussed above and for the durations discussed above allows the liner layer 62 to be formed with the desired nitrogen concentration. FIG. 16 is chart of experimental data from different processes for forming the liner layer 62. Specifically, FIG. 16 shows the initial and final nitrogen concentrations of the liner layer 62 (e.g., before and after the wet anneal process) when the third pulse of the ALD process was performed for different durations. The data points in region 102 are for liner layers formed by keeping the oxygen source precursor in the ALD chamber for a duration in the range discussed above. These liner layers had an initial nitrogen concentration in the range of about 5% to about 30%, and had a final nitrogen concentration in the range of about 1% to about 5%. The data point in region 104 is for a liner layer formed by keeping the oxygen source precursor in the ALD chamber for a duration outside of the range discussed above. This liner layer had an initial and final nitrogen concentration outside of the desired ranges.

Embodiments may achieve advantages. Forming the liner layer 62 with an initial nitrogen concentration in the range of about 5% to about 30% and an initial thickness in the range of about 15 Å to about 50 Å helps the liner layer 62 provide sufficient oxidation resistance to protect the fins 54 during the wet anneal process for forming the fill material 64, and also helps ensure the etch selectivity between the liner layer 62 and the fill material 64 is sufficiently reduced after the wet anneal process. Avoiding oxidation of the fins 54 helps improve channel mobility of the resulting FinFETs. Further, forming the liner layer 62 of silicon oxynitride can be advantageous over forming the liner layer 62 of other dielectric materials, such as silicon nitride. For example, silicon oxynitride suffers less charging effect than silicon nitride, helping reduce channel leakage of the resulting FinFETs.

In an embodiment, a method includes: forming a first fin and a second fin extending from a semiconductor substrate; depositing a liner layer along a first sidewall of the first fin, a second sidewall of the second fin, and a top surface of the semiconductor substrate, the liner layer formed of silicon oxynitride having a nitrogen concentration in a range of 5% to 30%; depositing a fill material on the liner layer, the fill material formed of silicon; annealing the liner layer and the fill material, the annealing converting the fill material to silicon oxide, the annealing decreasing the nitrogen concentration of the liner layer to a range of 1% to 5%; and recessing the liner layer and the fill material to form an isolation region between the first fin and the second fin. In some embodiments of the method, the annealing the liner layer and the fill material decreases a thickness of the liner layer. In some embodiments of the method, the thickness of the liner layer before the annealing is in a range of 15 Å to 50 Å, and the thickness of the liner layer after the annealing is in a range of 1 Å to 10 Å. In some embodiments of the method, the depositing the liner layer includes: placing the semiconductor substrate in a deposition chamber; performing an atomic layer deposition (ALD) cycle including: introducing hexachlorodisilane into the deposition chamber; purging the hexachlorodisilane from the deposition chamber; introducing oxygen into the deposition chamber; purging the oxygen from the deposition chamber; introducing ammonia into the deposition chamber; and purging the ammonia from the deposition chamber; and repeating the ALD cycle. In some embodiments of the method, the hexachlorodisilane is kept in the deposition chamber for a duration in a range of 5 seconds to 120 seconds, the oxygen is kept in the deposition chamber for a duration in a range of 5 seconds to 100 seconds, the ammonia is kept in the deposition chamber for a duration in a range of 5 seconds to 100 seconds, and the ALD cycle is repeated from 5 to 100 times. In some embodiments of the method, the introducing hexachlorodisilane, the introducing oxygen, and the introducing ammonia are each performed at a temperature in a range of 450° C. to 700° C. In some embodiments of the method, the annealing the liner layer and the fill material includes: performing a wet anneal process at a temperature in a range of 400° C. to 750° C. and for a duration in a range of 1 hour to 5 hours. In some embodiments of the method, the wet anneal process is performed with steam produced by in-situ steam generation (ISSG).

In an embodiment, a method includes: forming a first fin and a second fin extending from a semiconductor substrate; depositing a first dielectric material with an atomic layer deposition (ALD) process to form a liner layer along a first sidewall of the first fin, a second sidewall of the second fin, and a top surface of the semiconductor substrate; depositing a second dielectric material with a flowable chemical vapor deposition (FCVD) process to form a fill material on the liner layer, the second dielectric material being different from the first dielectric material, a portion of the liner layer being converted to the second dielectric material during the FCVD process; and recessing the liner layer and the fill material to form an isolation region between the first fin and the second fin.

In some embodiments of the method, the recessing the liner layer and the fill material includes: etching the liner layer and the fill material, top surfaces of the liner layer and the fill material being coplanar after the etching. In some embodiments of the method, the etching the liner layer and the fill material includes performing a wet etch using dilute hydrofluoric (dHF) acid, the wet etch removing the liner layer and the fill material at the same rate. In some embodiments of the method, before the FCVD process the first dielectric material is silicon oxynitride having a nitrogen concentration in a range of 5% to 30%, and after FCVD process the first dielectric material is silicon oxynitride having a nitrogen concentration in a range of 1% to 5%. In some embodiments of the method, before the FCVD process the liner layer has a thickness in a range of 15 Å to 50 Å, and after FCVD process the remaining portion of the liner layer has a thickness in a range of 1 Å to 10 Å. In some embodiments of the method, depositing the second dielectric material with the FCVD process includes: depositing silicon with a chemical vapor deposition (CVD) process; and performing a wet anneal process to convert the silicon to silicon oxide. In some embodiments of the method, no oxidation of the first fin or the second fin occurs during the wet anneal process. In some embodiments, the method further includes: forming a gate structure on the first fin, the second fin, and the isolation region; forming a first pair of source/drain regions in the first fin and adjacent the gate structure; and forming a second pair of source/drain regions in the second fin and adjacent the gate structure.

In an embodiment, a structure includes: a first fin extending from a substrate; a second fin extending from the substrate; an isolation region between the first fin and the second fin, the isolation region including: a main layer of silicon oxide; and a liner layer of silicon oxynitride having a nitrogen concentration in a range of 1% to 5%, the liner layer disposed between the main layer and each of the first fin, the second fin, and the substrate, top surfaces of the liner layer and the main layer being coplanar.

In some embodiments of the structure, the liner layer has a thickness in a range of 1 Å to 10 Å. In some embodiments, the structure further includes: a gate dielectric including an interfacial layer of silicon oxide on the first fin, the second fin, and the isolation region; and a gate electrode on the gate dielectric. In some embodiments of the structure, interfaces of the liner layer with each of the first fin and the second fin have a first effective oxide charge, and interfaces of the interfacial layer with each of the first fin and the second fin have a second effective oxide charge, the second effective oxide charge being greater than the first effective oxide charge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin extending from a semiconductor substrate;
   depositing a liner layer along a first sidewall of the first fin, a second sidewall of the second fin, and a top surface of the semiconductor substrate, the liner layer formed of silicon oxynitride;
   depositing a fill material on the liner layer, the fill material formed of silicon;
   annealing the liner layer and the fill material, the annealing converting the fill material to silicon oxide, the annealing decreasing a thickness of the liner layer; and
   recessing the liner layer and the fill material to form an isolation region between the first fin and the second fin.

2. The method of claim 1, wherein the thickness of the liner layer after the annealing is from 10% to 30% of the thickness of the liner layer before the annealing.

3. The method of claim 1, wherein the depositing the liner layer comprises:
   placing the semiconductor substrate in a deposition chamber;
   performing an atomic layer deposition cycle comprising:
      introducing a silicon source precursor into the deposition chamber;
      purging the silicon source precursor from the deposition chamber;
      introducing an oxygen source precursor into the deposition chamber;
      purging the oxygen source precursor from the deposition chamber;
      introducing a nitrogen source precursor into the deposition chamber; and
      purging the nitrogen source precursor from the deposition chamber; and
   repeating the atomic layer deposition cycle.

4. The method of claim 3, wherein the oxygen source precursor reacts with the nitrogen source precursor to form OH bonds, and the silicon source precursor breaks the OH bonds.

5. The method of claim 3, wherein the atomic layer deposition cycle is repeated until the thickness of the liner layer is in a range of 15 Å to 50 Å.

6. The method of claim 1, wherein the annealing the liner layer and the fill material comprises:
   annealing the liner layer and the fill material with a wet anneal process using steam.

7. The method of claim 6, wherein the wet anneal process is performed until the thickness of the liner layer is in a range of 1 Å to 10 Å.

8. The method of claim 1, wherein the recessing the liner layer and the fill material comprises:
   etching the liner layer and the fill material with an etching process, wherein the annealing decreases an etching selectivity between the liner layer and the fill material relative to the etching process.

9. A method comprising:
   forming a first fin and a second fin extending from a semiconductor substrate;
   depositing a liner layer along a first sidewall of the first fin, a second sidewall of the second fin, and a top surface of the semiconductor substrate, the liner layer formed of silicon oxynitride having a nitrogen concentration;

forming a fill material on the liner layer with a deposition process, the deposition process comprising:
depositing a semiconductor material on the liner layer; and
annealing the semiconductor material and the liner layer, the annealing converting the semiconductor material to the fill material, the annealing decreasing the nitrogen concentration of the liner layer; and
recessing the liner layer and the fill material to form an isolation region between the first fin and the second fin.

10. The method of claim 9, wherein the nitrogen concentration of the liner layer after the annealing is 10% of the nitrogen concentration of the liner layer before the annealing.

11. The method of claim 9, wherein the semiconductor material is silicon and the fill material is silicon oxide.

12. The method of claim 9, wherein the annealing decreases a thickness of the liner layer without eliminating the liner layer.

13. The method of claim 9, wherein the annealing does not oxidize the first fin or the second fin.

14. The method of claim 9, wherein the first fin and the second fin extend away from the semiconductor substrate in a first direction, and after the annealing, the nitrogen concentration of the liner layer decreases in the first direction.

15. A method comprising:
forming a first fin and a second fin extending from a semiconductor substrate;
depositing a liner material along a first sidewall of the first fin, a second sidewall of the second fin, and a top surface of the semiconductor substrate with a first deposition process;
forming a fill material on the liner material with a second deposition process, the second deposition process comprising:
depositing a semiconductor material on the liner material; and
annealing the semiconductor material and the liner material, the annealing converting the semiconductor material to the fill material, the annealing decreasing an etching selectivity between the liner material and the fill material relative to an etching process; and
recessing the liner material and the fill material by etching the liner material and the fill material with the etching process.

16. The method of claim 15, wherein the annealing decreases a thickness of the liner material.

17. The method of claim 15, wherein the annealing decreases a nitrogen concentration of the liner material.

18. The method of claim 15, wherein no oxidation of the first fin or the second fin occurs during the annealing.

19. The method of claim 15, wherein recessing the liner material and the fill material forms an isolation region between the first fin and the second fin, the method further comprising:
forming a gate structure on a top surface of the isolation region, the gate structure extending between the first fin and the second fin.

20. The method of claim 15, wherein the first deposition process is a different type of process than the second deposition process.

* * * * *